(12) United States Patent
Lin et al.

(10) Patent No.: US 9,985,134 B1
(45) Date of Patent: May 29, 2018

(54) FINFETS AND METHODS OF FORMING FINFETS

(71) Applicant: Taiwan Semiconductor Manufacturing Company, Ltd., Hsinchu (TW)

(72) Inventors: Chin-Hsiang Lin, Hsinchu (TW); Tai-Chun Huang, Hsinchu (TW); Tien-I Bao, Taoyuan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days. days.

(21) Appl. No.: 15/455,603

(22) Filed: Mar. 10, 2017

Related U.S. Application Data

(60) Provisional application No. 62/427,584, filed on Nov. 29, 2016.

(51) Int. Cl.
| | |
|---|---|
| *H01L 21/82* | (2006.01) |
| *H01L 29/78* | (2006.01) |
| *H01L 23/528* | (2006.01) |
| *H01L 29/66* | (2006.01) |
| *H01L 21/033* | (2006.01) |
| *H01L 21/02* | (2006.01) |
| *H01L 21/768* | (2006.01) |
| *H01L 21/8234* | (2006.01) |

(52) U.S. Cl.
CPC ...... *H01L 29/7851* (2013.01); *H01L 21/0214* (2013.01); *H01L 21/0217* (2013.01); *H01L 21/02167* (2013.01); *H01L 21/0332* (2013.01); *H01L 21/76843* (2013.01); *H01L 21/823431* (2013.01); *H01L 21/823475* (2013.01); *H01L 23/5283* (2013.01); *H01L 29/66545* (2013.01); *H01L 29/66795* (2013.01)

(58) Field of Classification Search
CPC ....... H01L 21/823431; H01L 21/76897; H01L 29/785
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |

(Continued)

*Primary Examiner* — Mark Prenty
(74) *Attorney, Agent, or Firm* — Slater Matsil, LLP

(57) ABSTRACT

An embodiment is a method including recessing a gate electrode over a semiconductor fin on a substrate to form a first recess from a top surface of a dielectric layer, forming a first mask in the first recess over the recessed gate electrode, recessing a first conductive contact over a source/drain region of the semiconductor fin to form a second recess from the top surface of the dielectric layer, and forming a second mask in the second recess over the recessed first conductive contact.

20 Claims, 38 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,799,560 B2 * | 10/2017 | Song ................. H01L 21/76897 |
| 2014/0001574 A1 | 1/2014 | Chen et al. |
| 2014/0110755 A1 | 4/2014 | Colinge |
| 2014/0151812 A1 | 6/2014 | Liaw |

\* cited by examiner

FINFETS AND METHODS OF FORMING FINFETS

This application claims the benefit of U.S. Provisional Application No. 62/427,584, filed on Nov. 29, 2016, entitled "Finfets and Methods of Forming Finfets," which application is hereby incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. However, there are challenges to implementation of such features and processes in semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
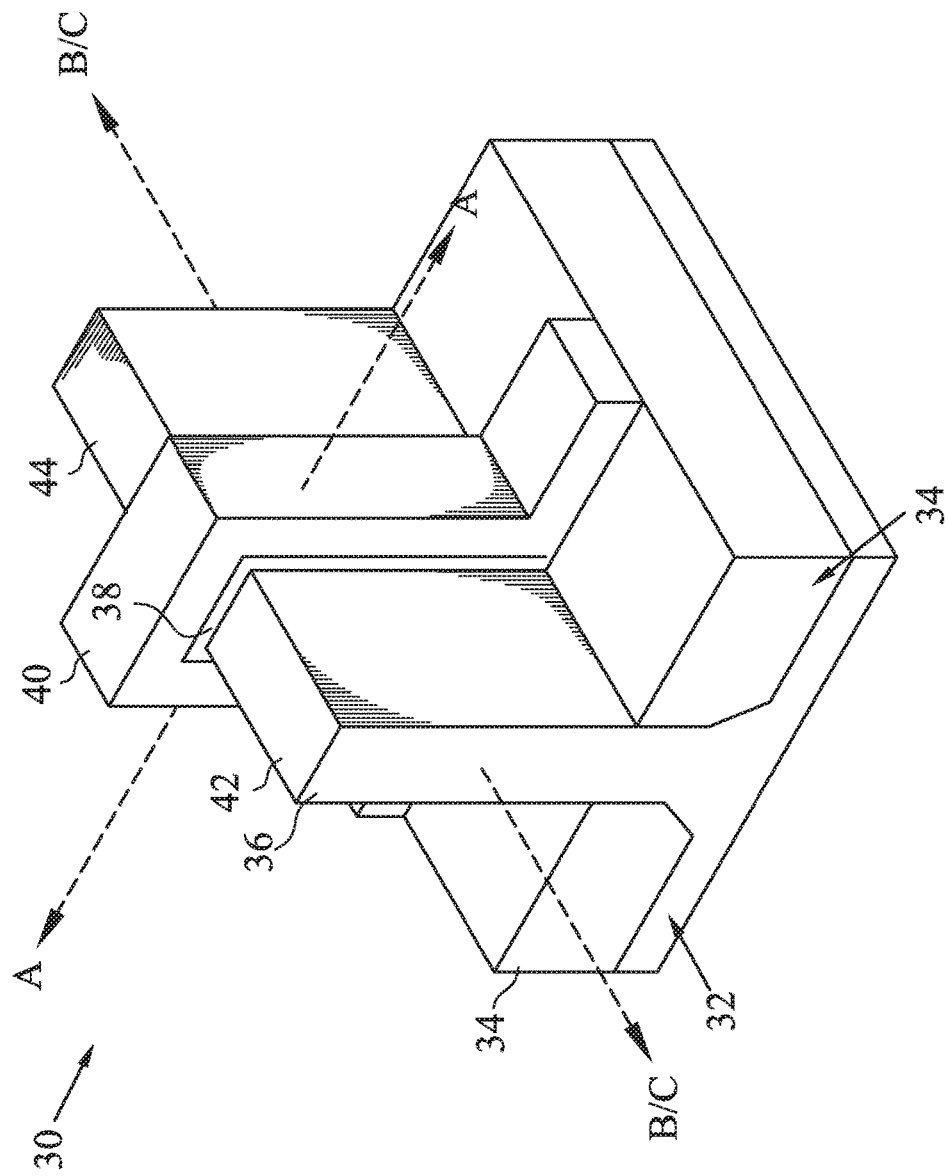
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-first process. In other embodiments, a gate-last process (sometimes referred to as replacement gate process) may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to provide a simple and cost-effective process flow to reduce the possibility of electrical shorts/leakage between a gate electrode and source/drain contacts when forming vias to the gate electrode. In addition, this simple and cost-effective process flow allows for the layout of the gate electrode to be shortened as the via to the gate electrode can be closer to the vias for the source/drain contacts. In particular, embodiments such as those disclosed below include a process flow that utilizes a mask over both the gate electrode and the source/drain contacts to allow for vias to the gate electrode and the source/drain contacts to both be self-aligned. These masks over the gate electrode and the source/drain contacts ensures that the overlying vias do not electrically short the gate electrode to the source/drain contacts even when the overlying vias are misaligned.

FIG. 1 illustrates an example of a fin field-effect transistor (FinFET) 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 13 further illustrates reference cross-sections that are used in later figures. Cross-section A-A is across a channel, gate dielectric 38, and gate electrode 40 of the FinFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 20C are cross-sectional views of intermediate stages in the manufacturing of FinFETs in accordance with an exemplary embodiment. FIGS. 2 through 6 illustrate reference cross-section A-A illustrated in FIG. 1, except for multiple FinFETs. In FIGS. 7A through 20C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 2:
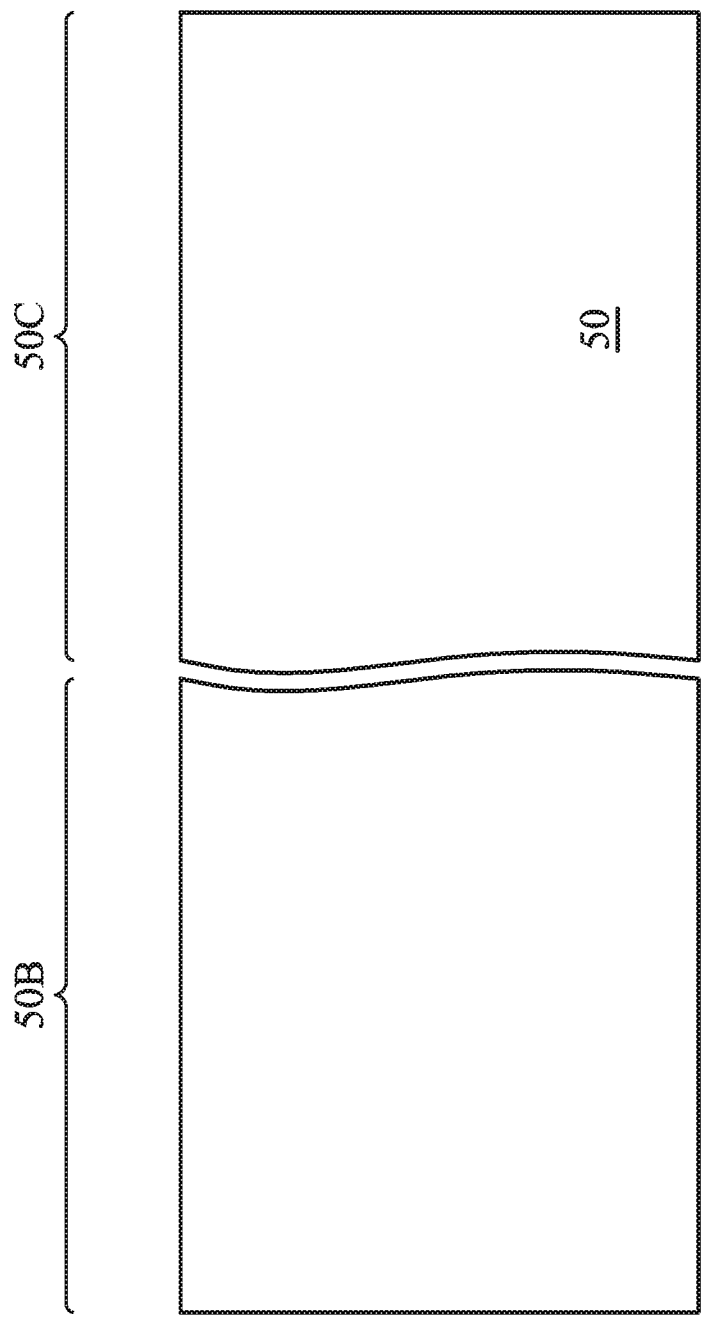
FIGS. 2 through 6, 7A-7C, 8A-8C, 9A-9C, 10A-10C, 11A-11C, 12A-12C, 13A-13C, 14A-14C, 15A-15C, 16A-16C, 17A-17C, 18A-18C, 19A-19C, and 20A-20C are cross-sectional views of intermediate stages in the manufacturing of FinFETs in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 3:
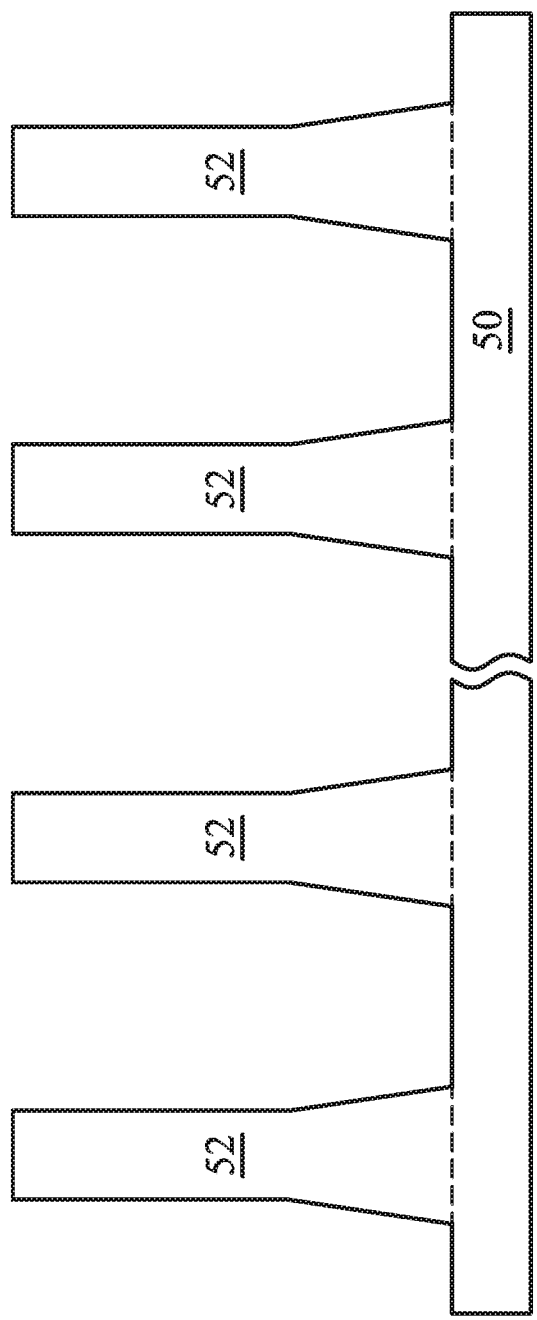
Figure 4:
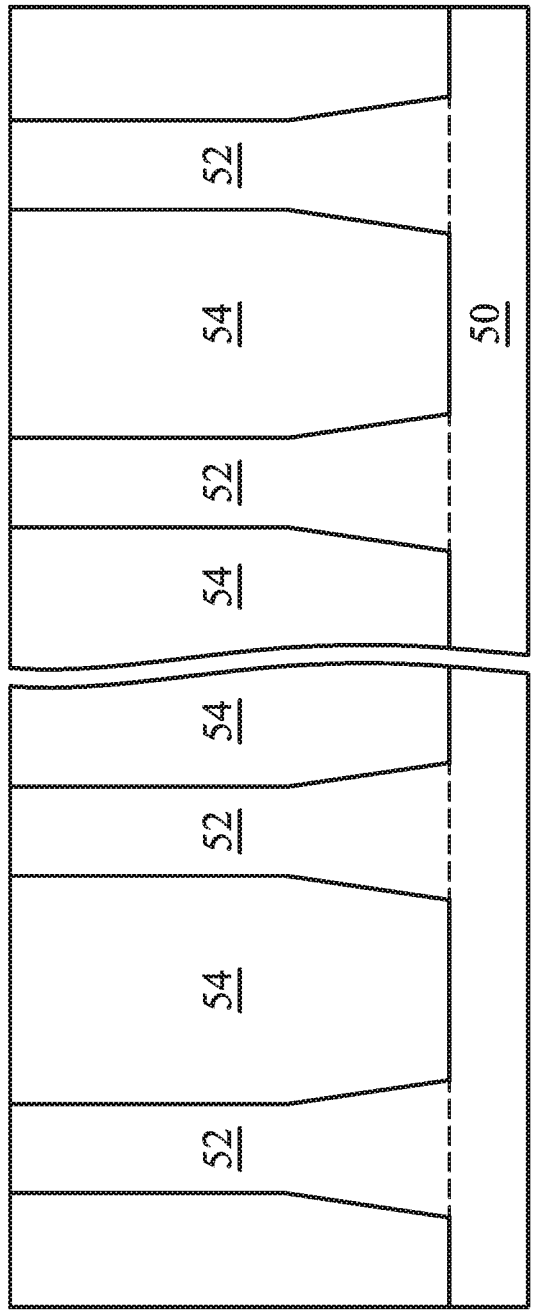

FIGS. 3 and 4 illustrate the formation of fins 52 and isolation regions 54 between neighboring fins 52. In FIG. 3 fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4 an insulation material 54 is formed between neighboring fins 52 to form the isolation regions 54. The insulation material 54 may be an oxide, such as silicon oxide and/or a carbon-containing oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), spin-on coating, the like, or a combination thereof. Other insulation materials formed by any acceptable process may be used. An anneal process may be performed once the insulation material is formed. In the illustrated embodiment, the insulation material 54 is silicon oxide formed by a FCVD process. The insulating material 54 may be referred to as isolation regions 54. Further in FIG. 4, a planarization process, such as a chemical mechanical polish (CMP), may remove any excess insulation material 54 and form top surfaces of the isolation regions 54 and top surfaces of the fins 52 that are coplanar.

Figure 5:
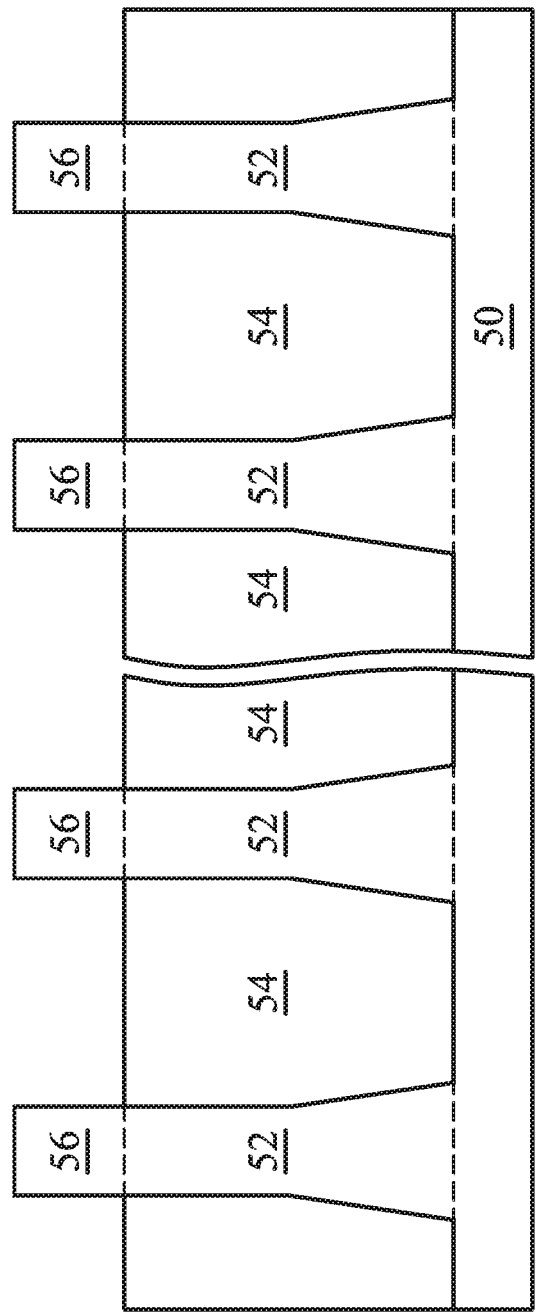

FIG. 5 illustrates the recessing of the isolation regions 54 to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how fins 56 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 4 can be recessed, and a material different from the semiconductor strips 52 may be epitaxially grown in their place.

In some other embodiments, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 5, appropriate wells may be formed in the fins 56, fins 52, and/or substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region, such as the PMOS region. The p-type impurities may be boron, BF$_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 50B and the second region 50C, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 6:
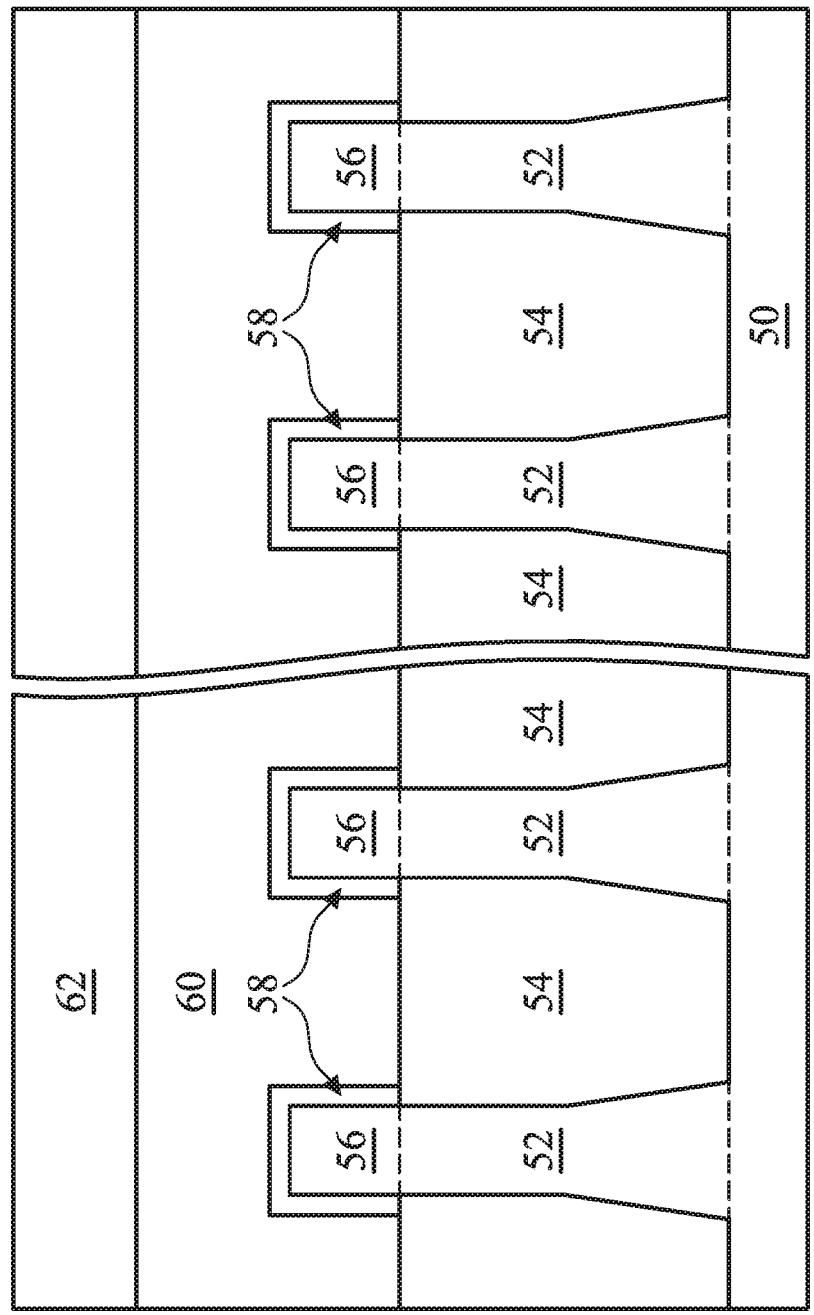

In FIG. 6, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP, an etch back process, or a combination thereof. The mask layer 62 may be deposited over the dummy gate layer 60. The dummy gate layer 60 may be made of, for example, polysilicon or amorphous silicon, although other materials that have a high etching selectivity from the etching of isolation regions 54 may also be used. The mask layer 62 may include, for example, silicon oxide, silicon nitride, or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

Figure 7A:
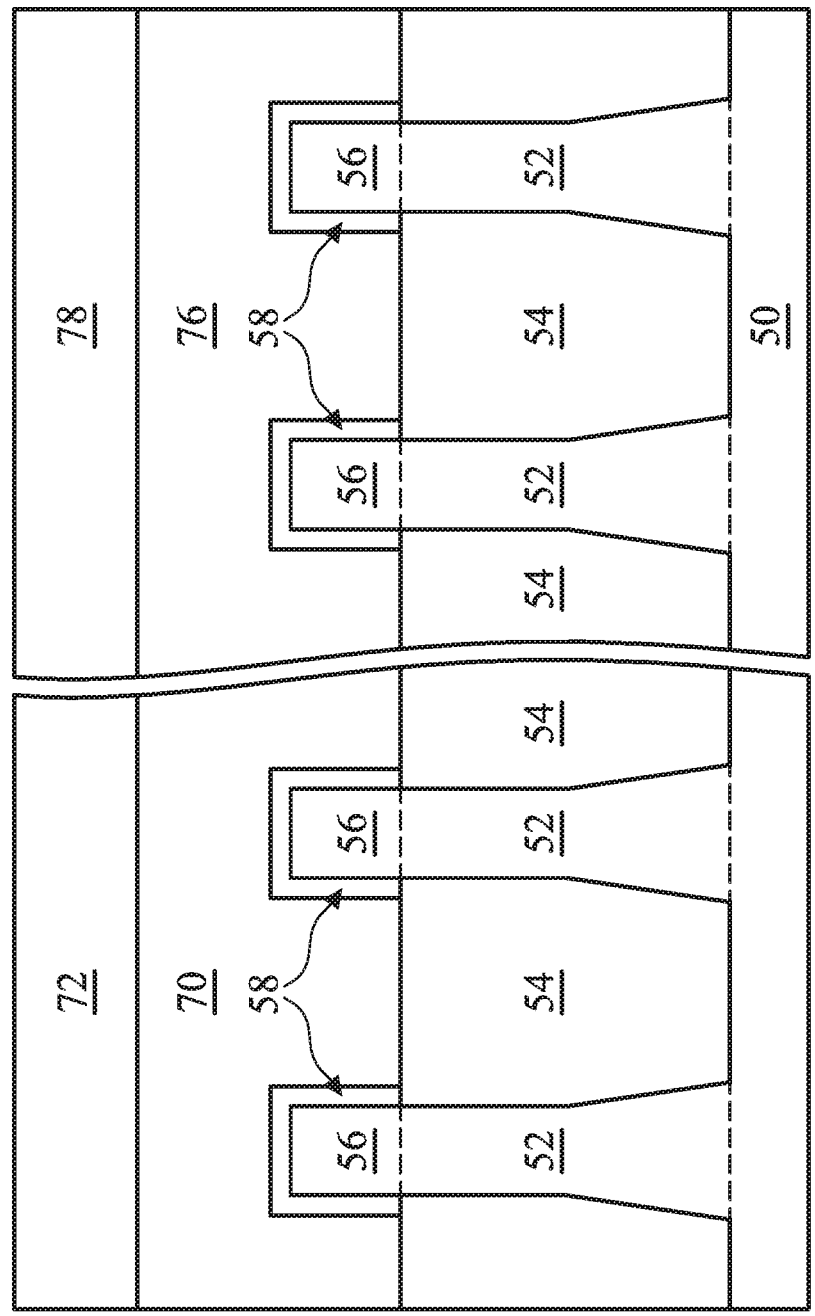
Figure 7C:
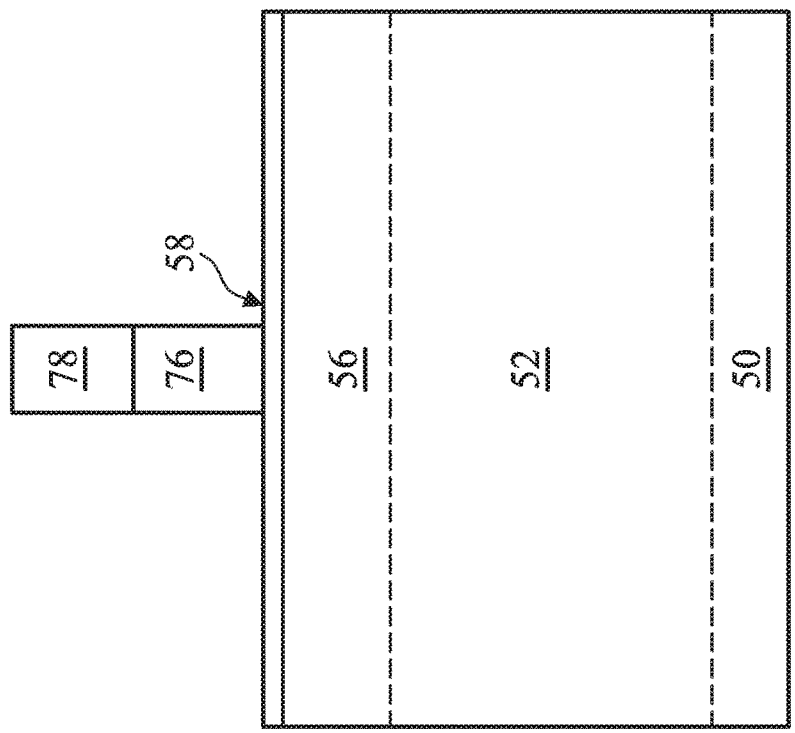
Figure 7B:
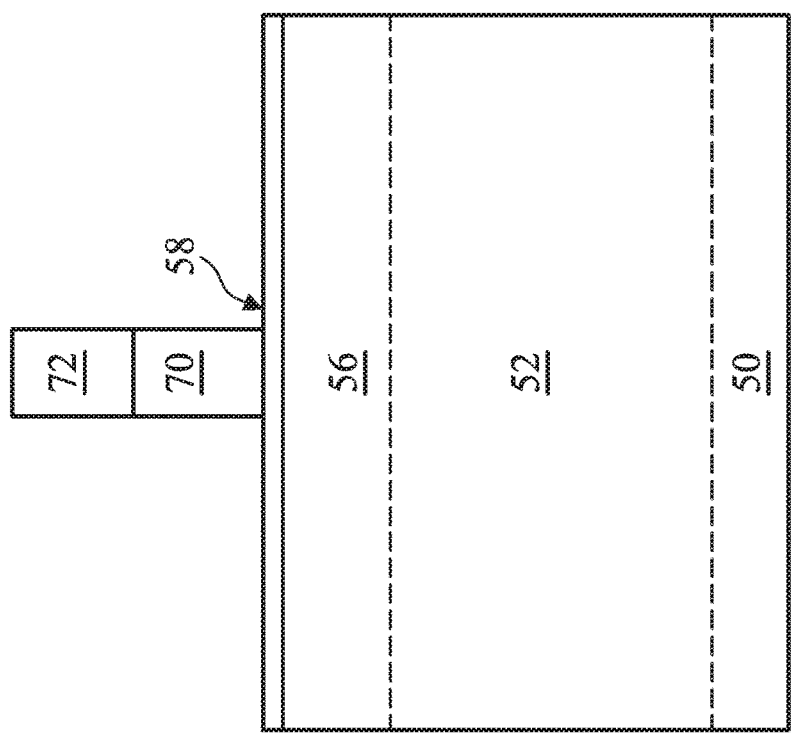

In FIGS. 7A, 7B, and 7C, the mask layer 62 may be patterned using acceptable photolithography and etching techniques to form masks 72 in the first region 50B (as illustrated in FIG. 7B) and masks 78 in the second region 50C (as illustrated in FIG. 7C). The pattern of the masks 72 and 78 then may be transferred to the dummy gate layer 60 and dummy dielectric layer 58 by an acceptable etching technique to form dummy gates 70 in the first region 50B and dummy gates 76 in the second region 50C. The dummy gates 70 and 76 cover respective channel regions of the fins 56. The dummy gates 70 and 76 may also have a lengthwise direction substantially perpendicular to the lengthwise direction of respective epitaxial fins.

Figure 8A:
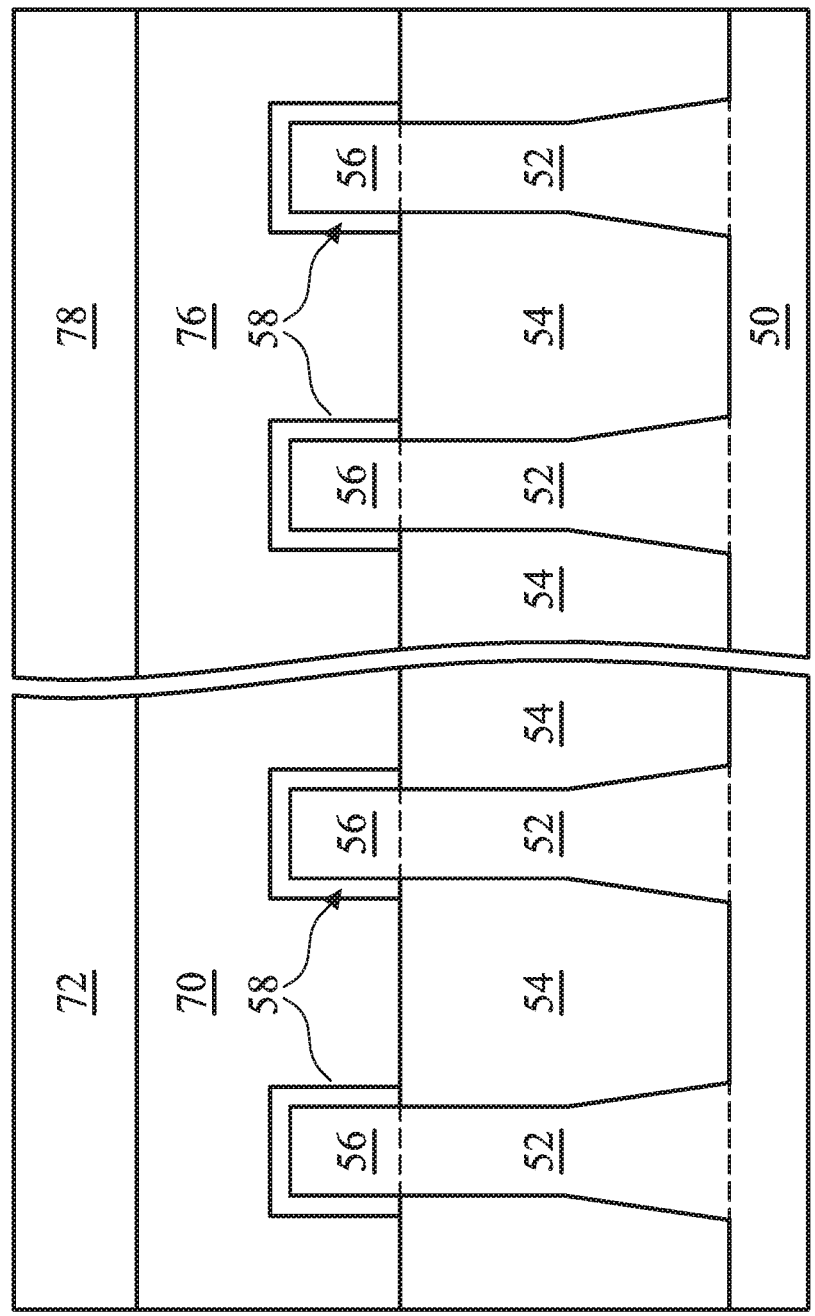
Figure 8C:
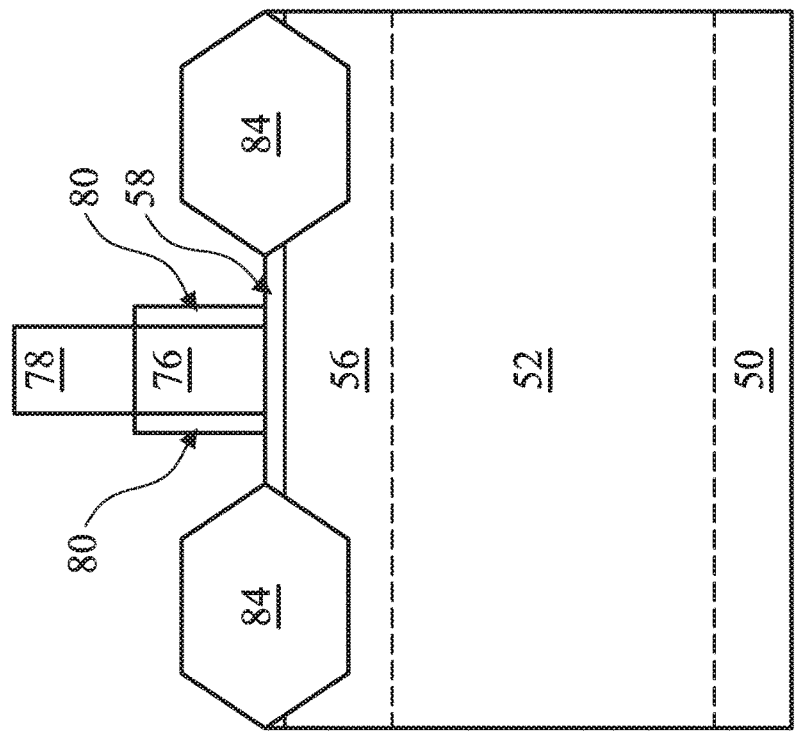
Figure 8B:
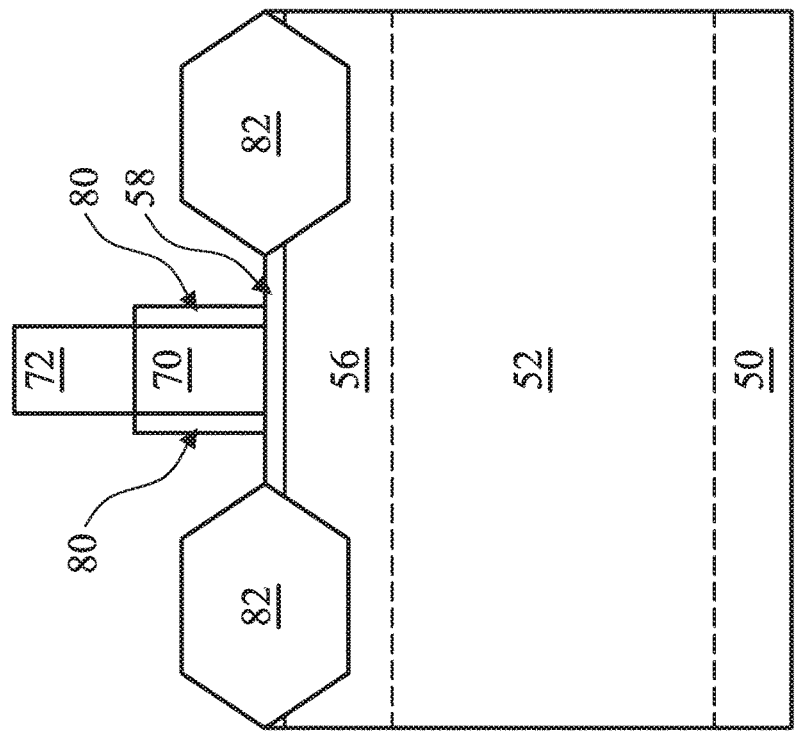

In FIGS. 8A, 8B, and 8C, gate seal spacers 80 can be formed on exposed surfaces of respective dummy gates 70 and 76 and/or fins 56. A thermal oxidation or a deposition followed by an anisotropic etch may form the gate seal spacers 80.

After the formation of the gate seal spacers 80, implants for lightly doped source/drain (LDD) regions may be performed. Similar to the implants discussed above in FIG. 17, a mask, such as a photoresist, may be formed over the first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over the second region 50C while exposing the first region 50B, and n-type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 8A, 8B, and 8C, epitaxial source/drain regions 82 and 84 are formed in the fins 56. In the first region 50B, epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52. In the second region 50C, epitaxial source/drain regions 84 are formed in the fins 56 such that each dummy gate 76 is disposed between respective neighboring pairs of the epitaxial source/drain regions 84. In some embodiments that epitaxial source/drain regions 84 may extend into the fins 52.

Epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

Epitaxial source/drain regions 84 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 76 and/or gate seal spacers 80 in the second region 50C. Then, source/drain regions of the epitaxial fins in the second region 50C are etched to form recesses. The epitaxial source/drain regions 84 in the second region 50C are epitaxially grown in the recesses. The epitaxial source/drain regions 84 may include any acceptable material, such as appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. Subsequently, the dummy gate spacers in the second region 50C are removed, for example, by an etch, as is the mask on the first region 50B.

Figure 9A:
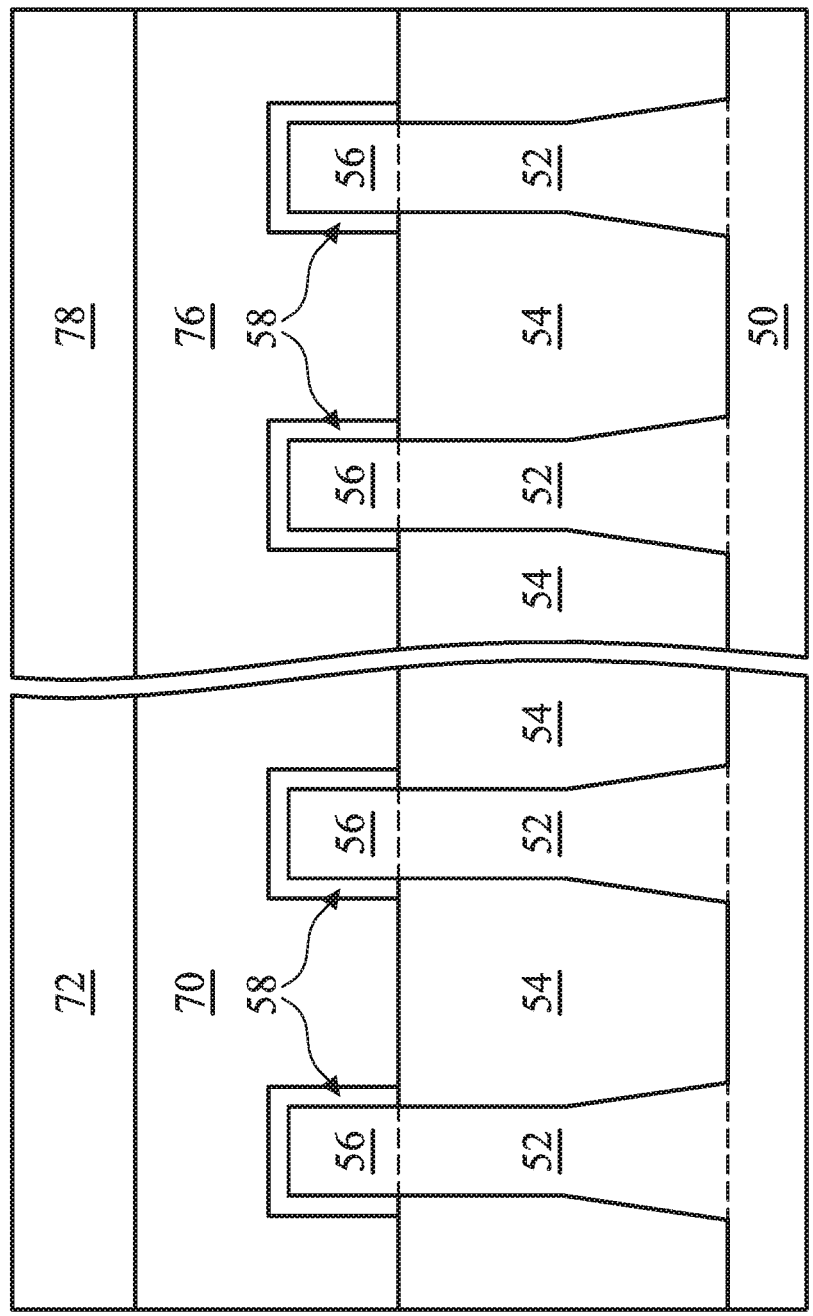
Figure 9C:
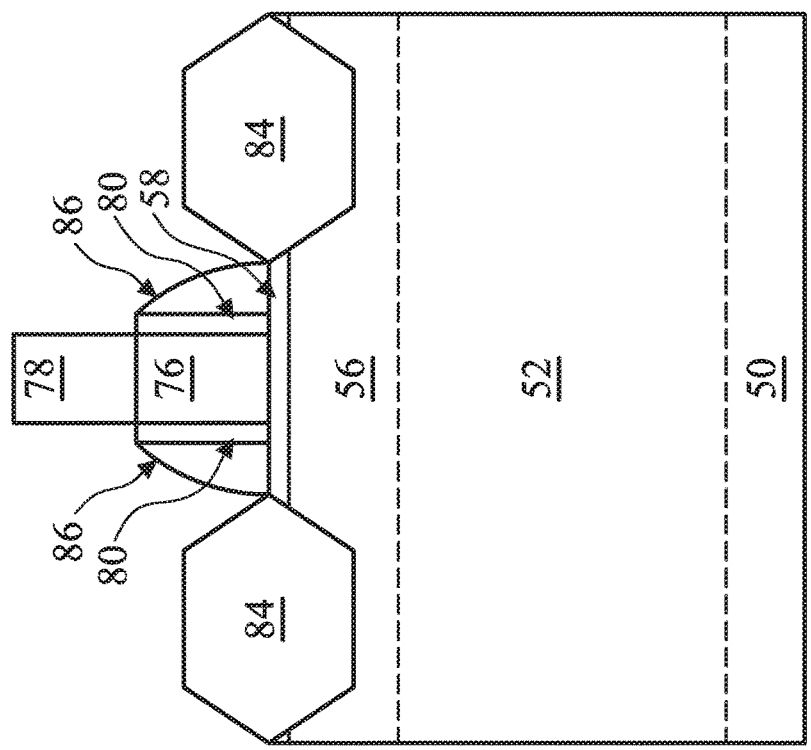
Figure 9B:
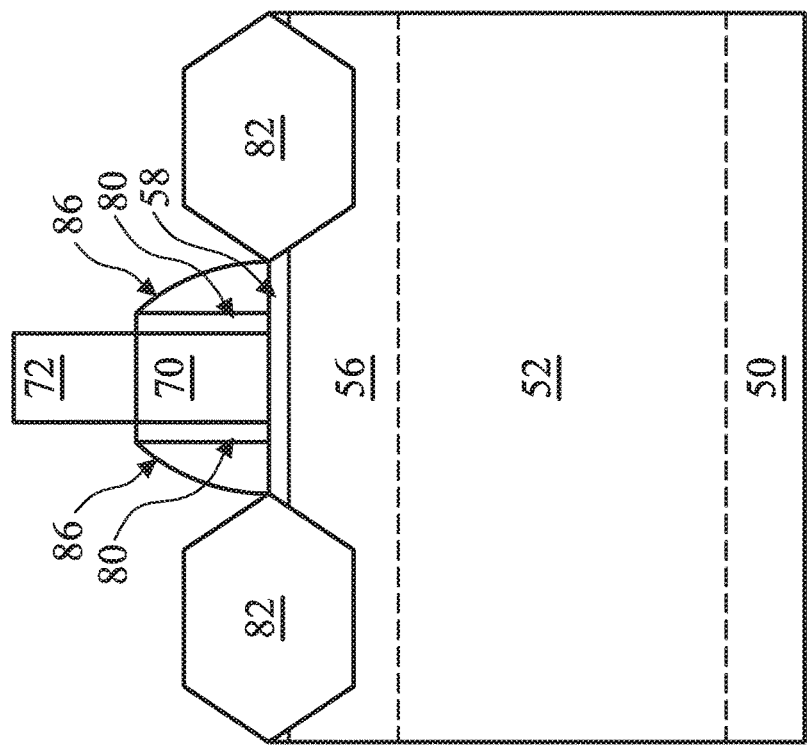

In FIGS. 9A, 9B, and 9C, gate spacers 86 are formed on the gate seal spacers 80 along sidewalls of the dummy gates 70 and 76. The gate spacers 86 may be formed by conformally depositing a material and subsequently anisotropically etching the material. The material of the gate spacers 86 may be silicon nitride, SiCN, carbon-containing silicon oxide, a combination thereof, or the like. The gate spacers 86 may also extend up along sidewalls of the masks 72 and 78.

The epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 82 and 84 may be in situ doped during growth.

Figure 10A:
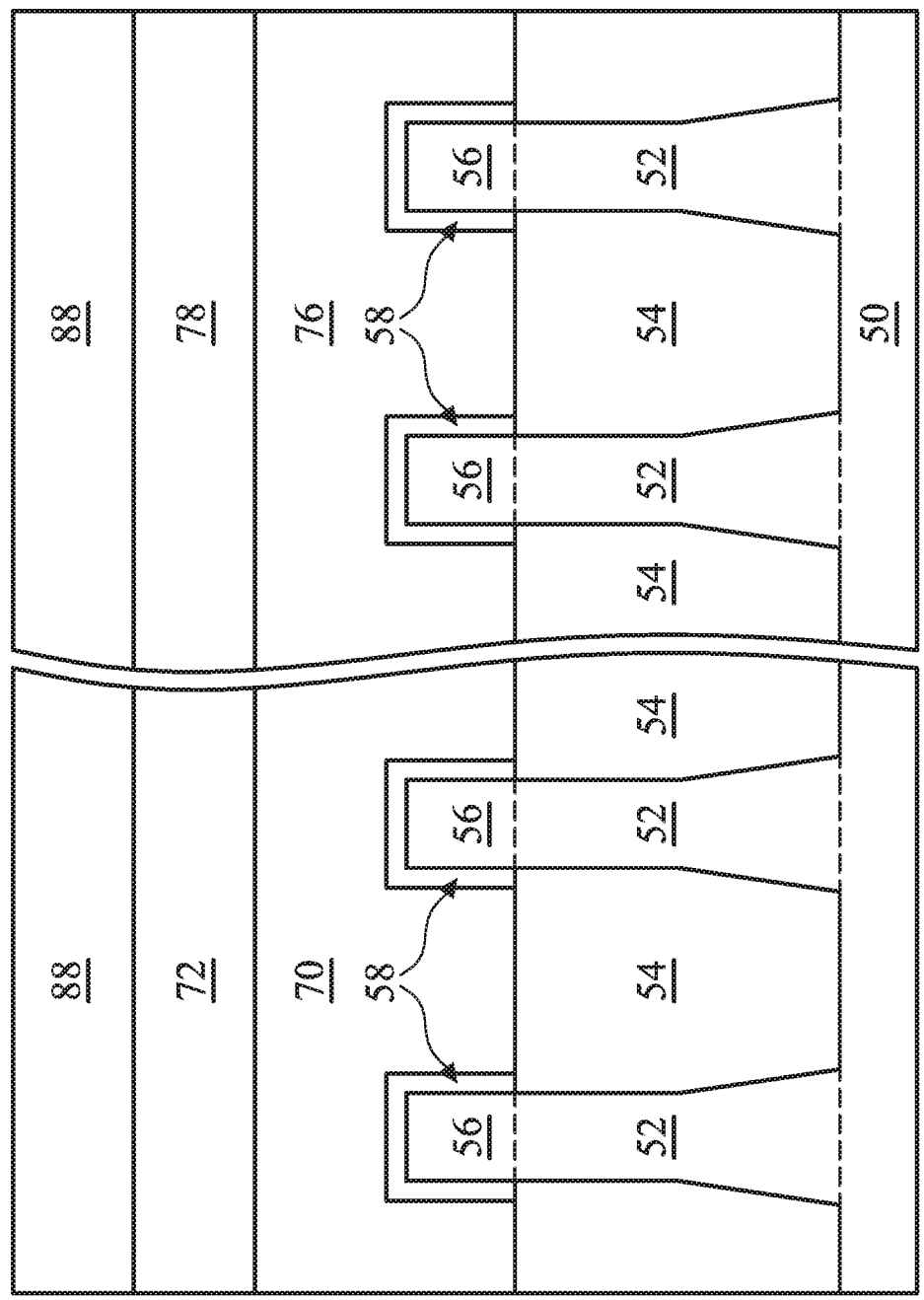
Figure 10C:
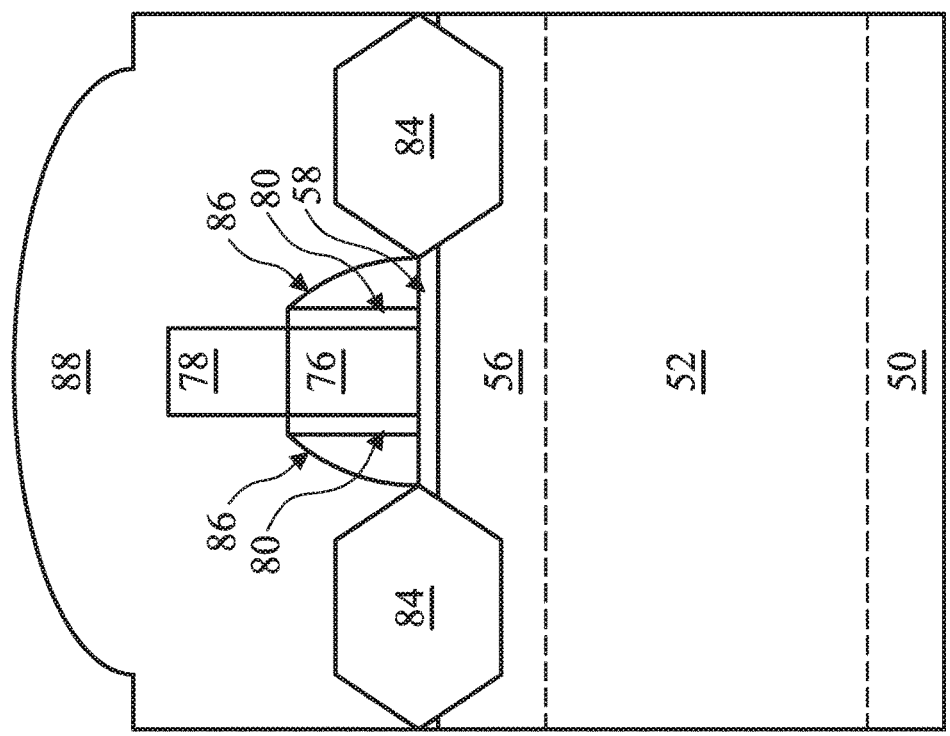
Figure 10B:
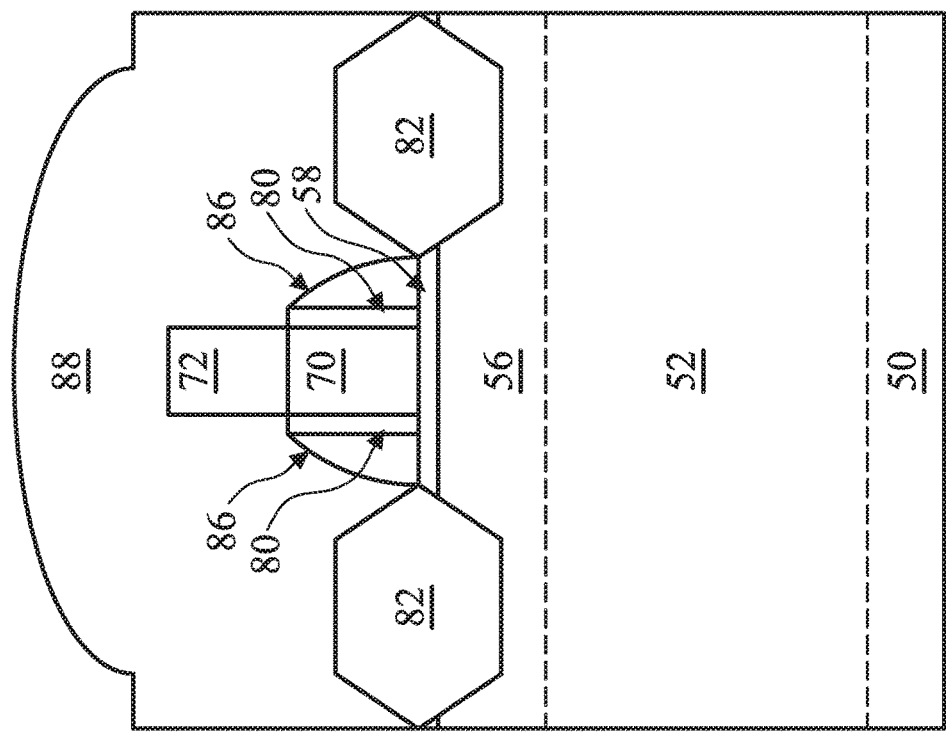

In FIGS. 10A, 10B, and 10C, an ILD 88 is deposited over the structure illustrated in FIGS. 9A, 9B, and 9C. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, spin-on coating, plasma-enhanced CVD (PECVD), or a combination thereof.

Figure 11A:
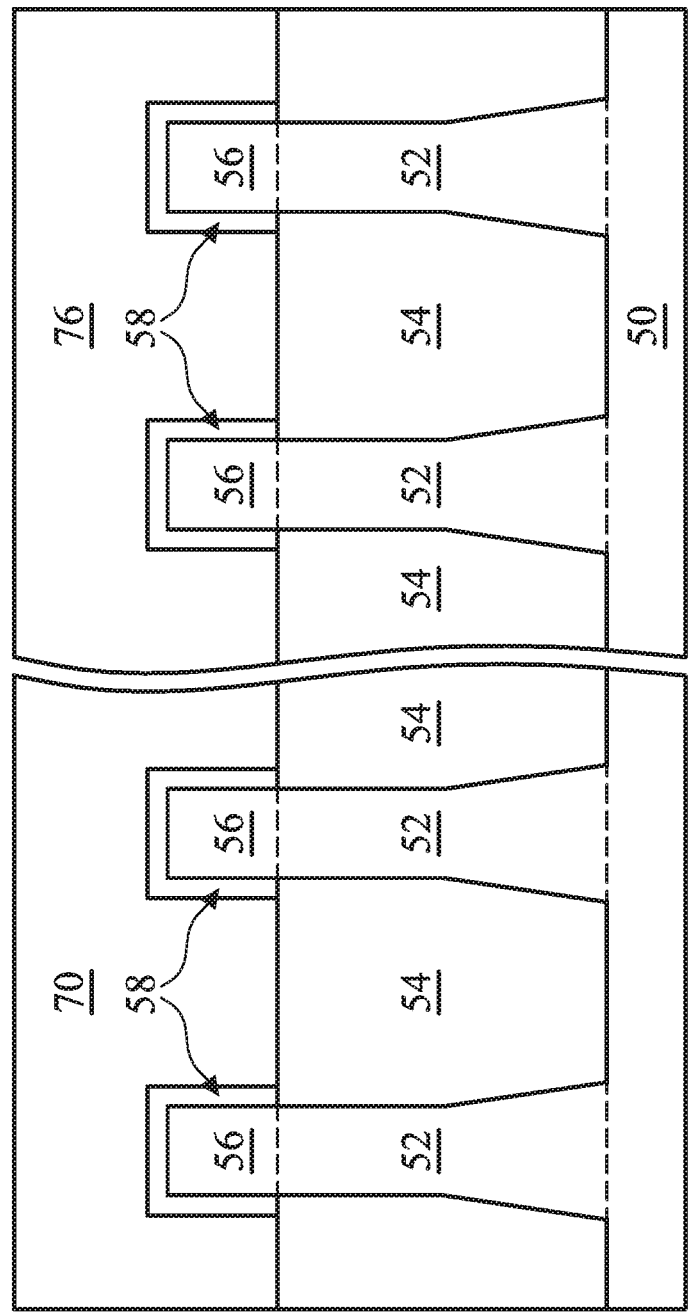
Figure 11B:
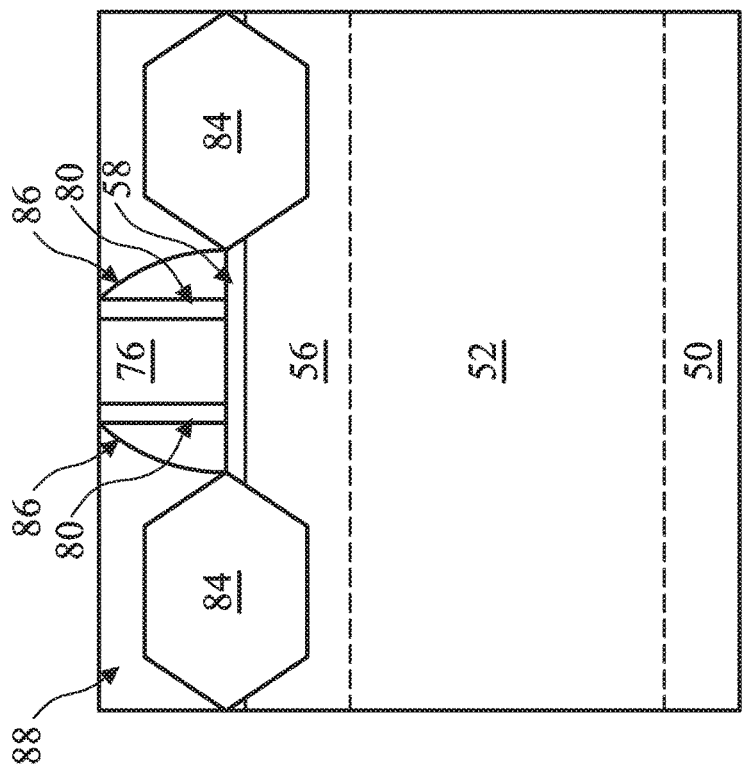
Figure 11C:
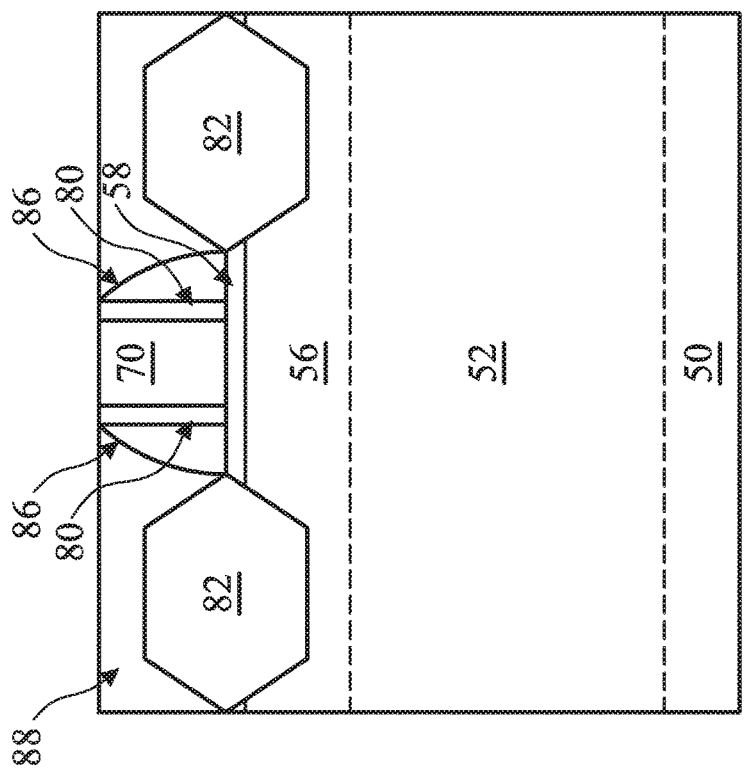

In FIGS. 11A, 11B, and 11C, a planarization process, such as a CMP, may be performed to level the top surface of ILD 88 with the top surfaces of the dummy gates 70 and 76. The CMP may also remove the masks 72 and 78 on the dummy gates 70 and 76. Accordingly, top surfaces of the dummy gates 70 and 76 are exposed through the ILD 88.

Figure 12A:
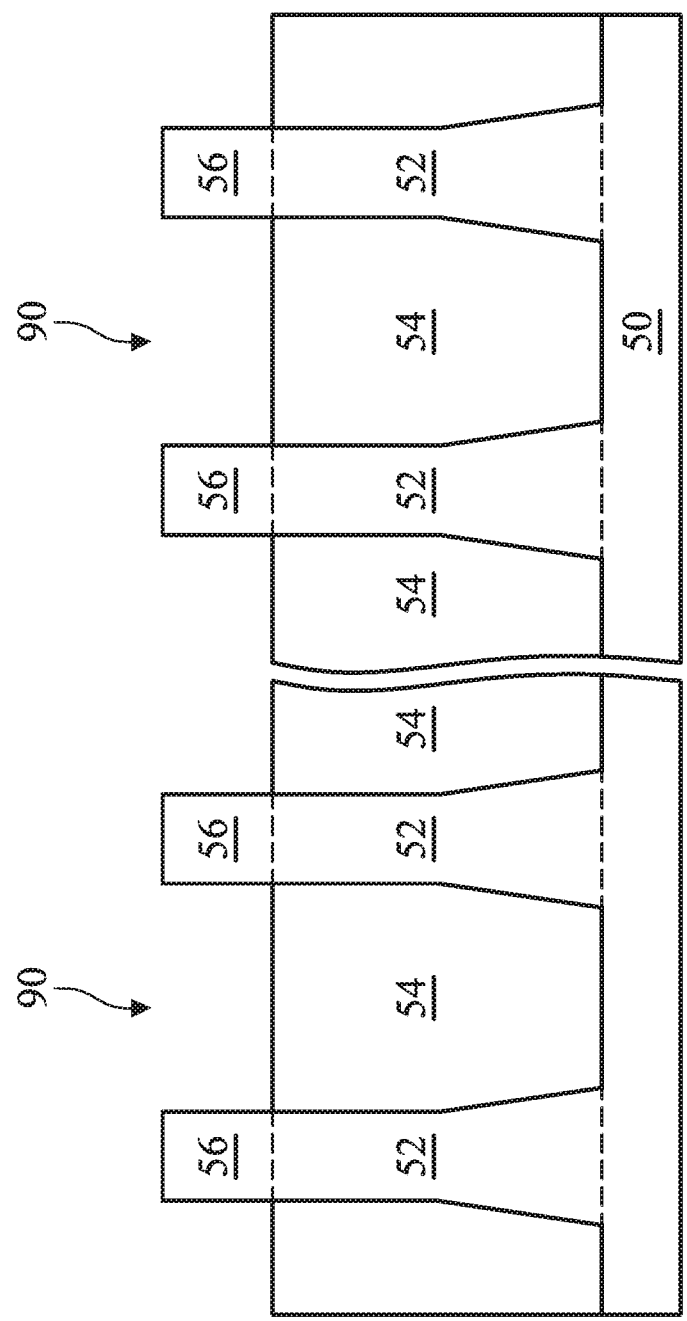
Figure 12C:
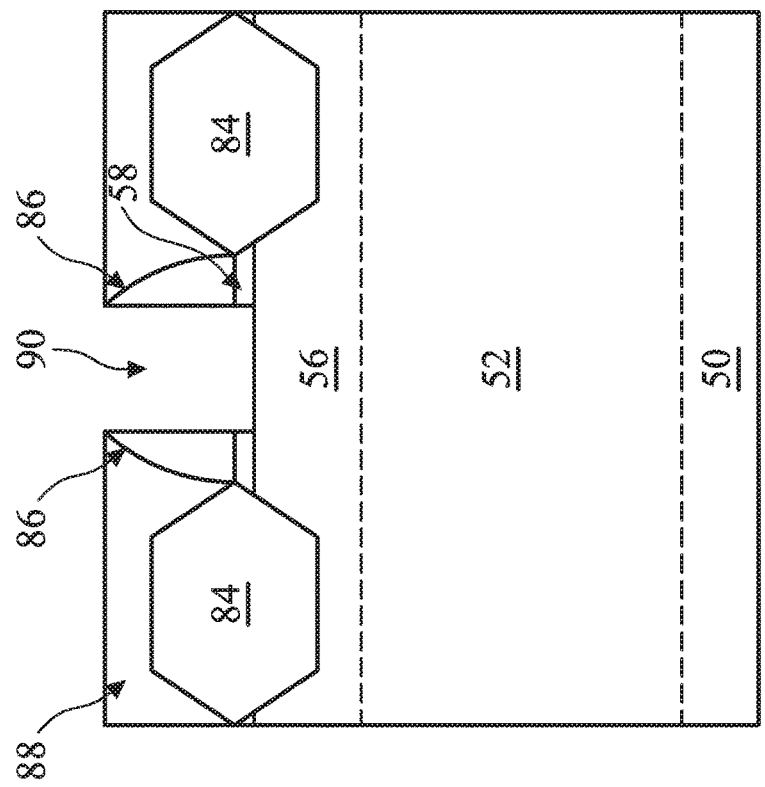
Figure 12B:
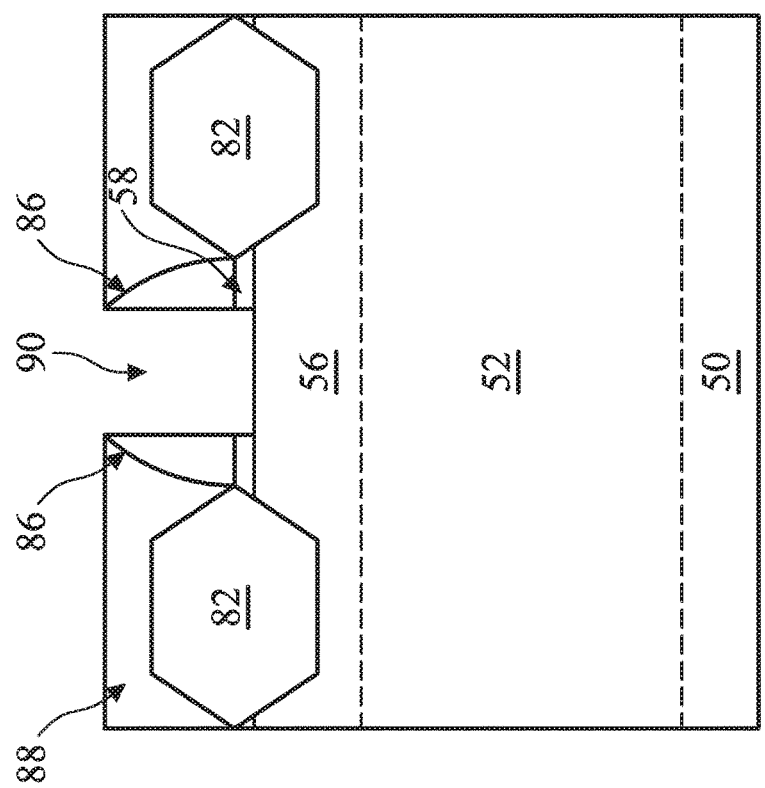

In FIGS. 12A, 12B, and 12C, the dummy gates 70 and 76, gate seal spacers 80, and portions of the dummy dielectric layer 58 directly underlying the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 and gate seal spacers 80 may then be removed after the removal of the dummy gates 70 and 76.

Figure 13A:
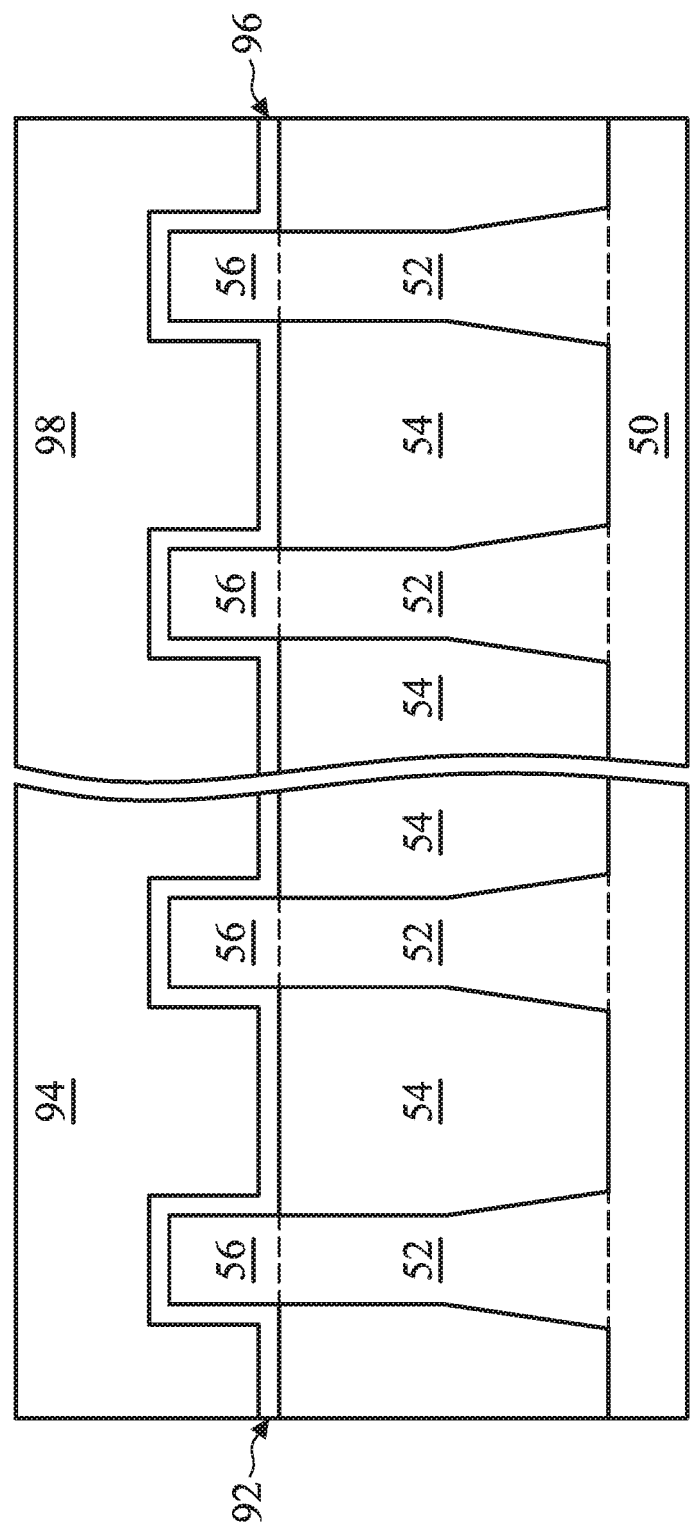
Figure 13C:
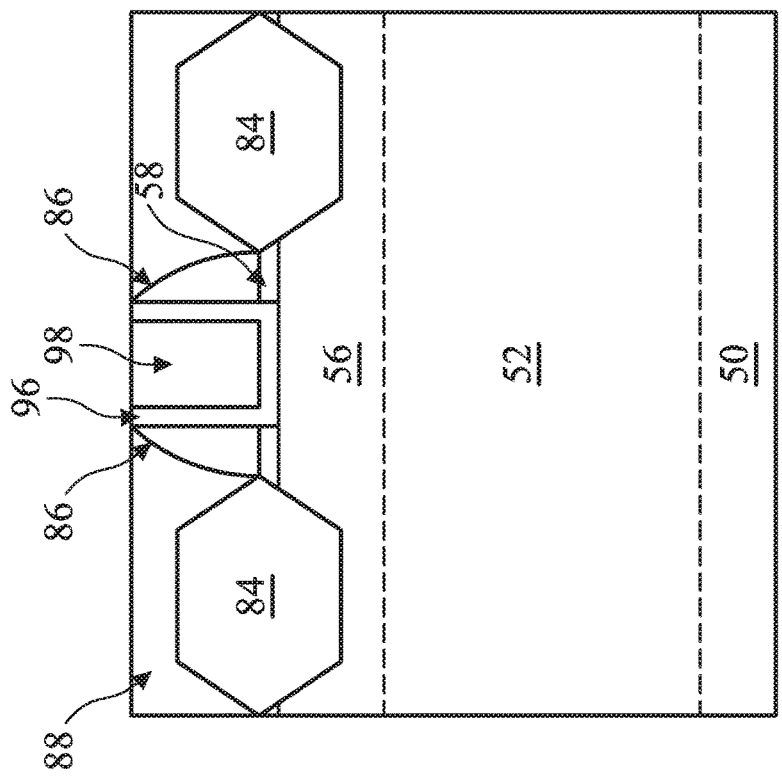
Figure 13B:
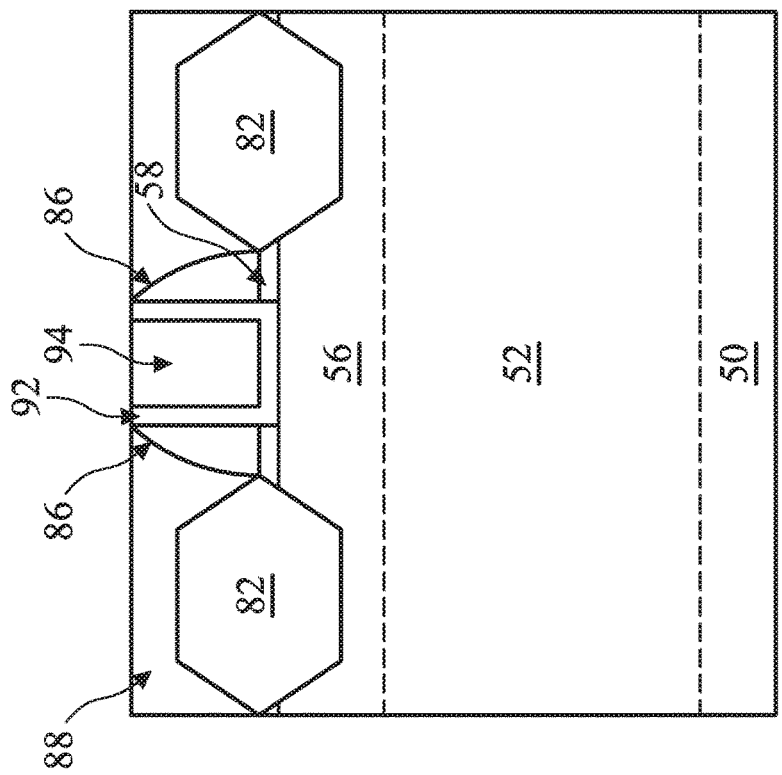

In FIGS. 13A, 13B, and 13C, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, W, combinations thereof, or multi-layers thereof. After the filling of gate electrodes 94 and 98, in step 228, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting FinFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 14A:
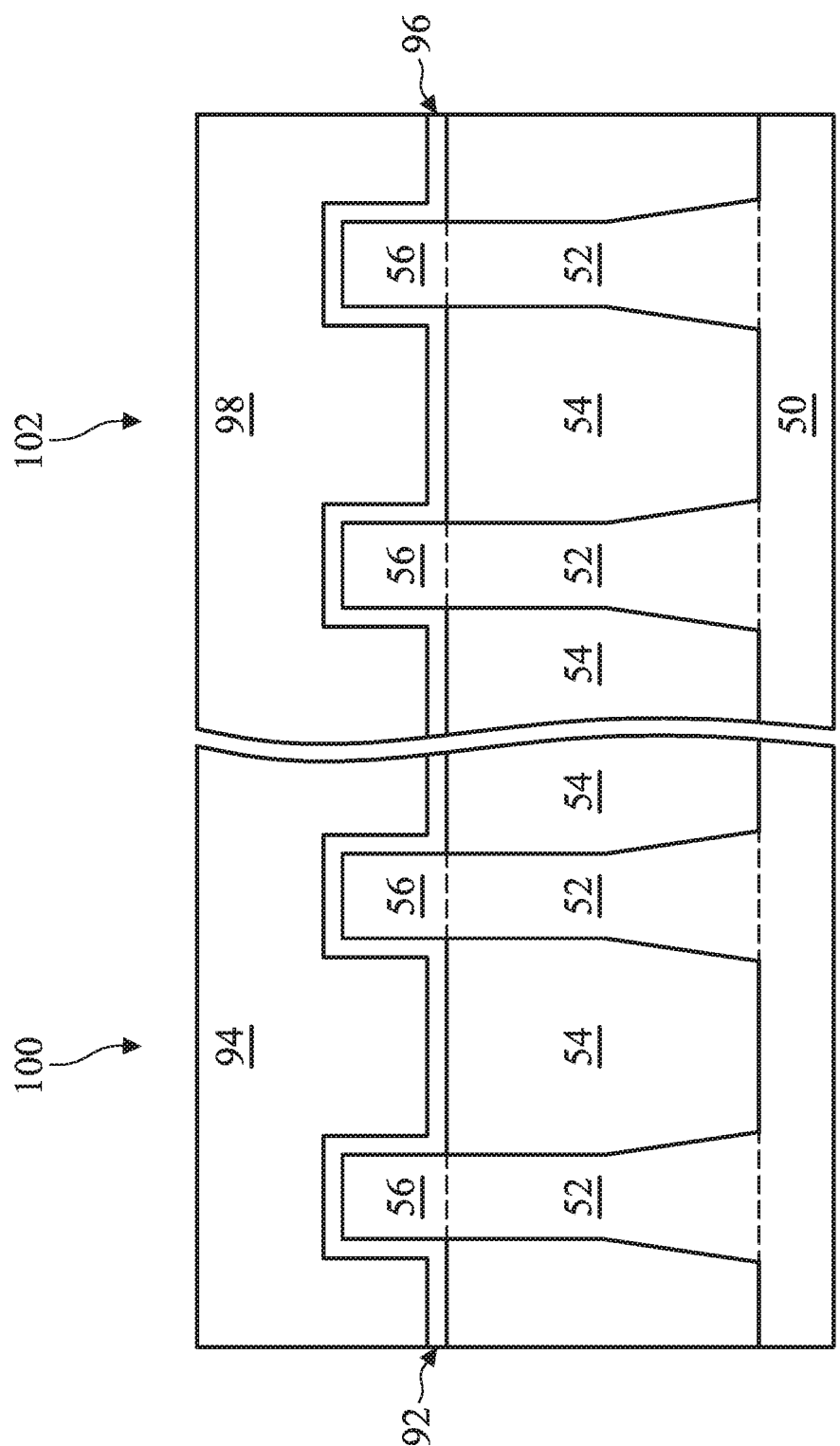
Figure 14C:
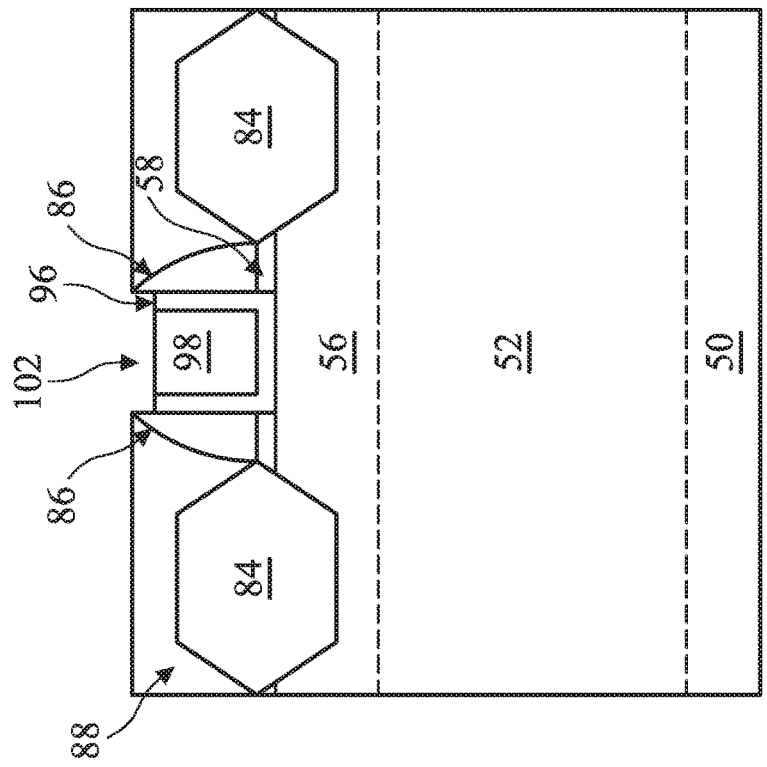
Figure 14B:
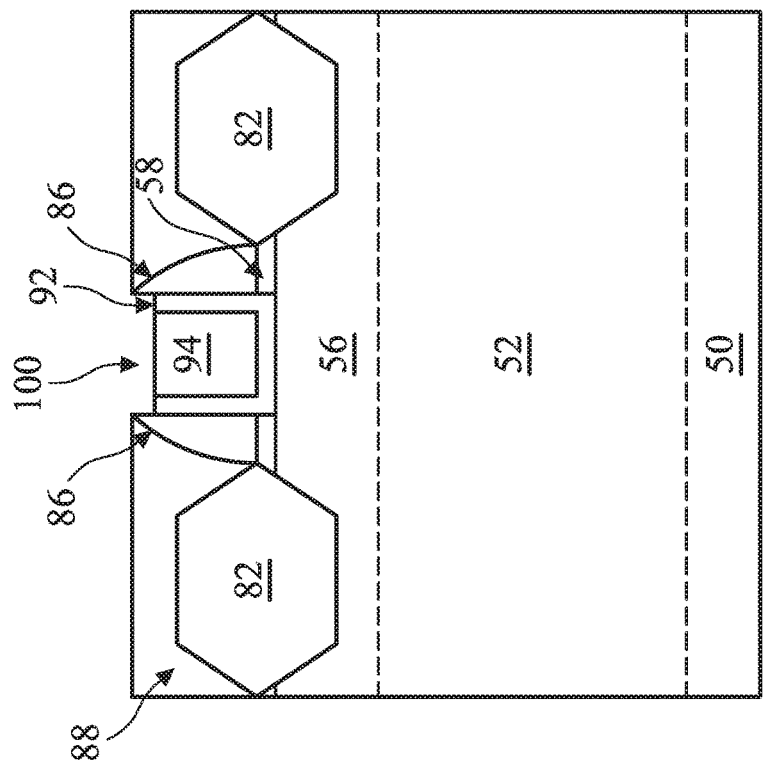

In FIGS. 14A, 14B, and 14C, the gate dielectric layers 92 and 96 and the gate electrodes 94 and 98 are recessed in an etching step(s), so that recesses 100 and 102 are formed. The etching step(s) may include an anisotropic dry etch. For example, the etching step(s) may include a dry etch process using reaction gas(es) that selectively etch the gate dielectric layers 92 and 96 and the gate electrodes 94 and 98 without etching the ILD 88 or the gate spacers 86.

Figure 15A:
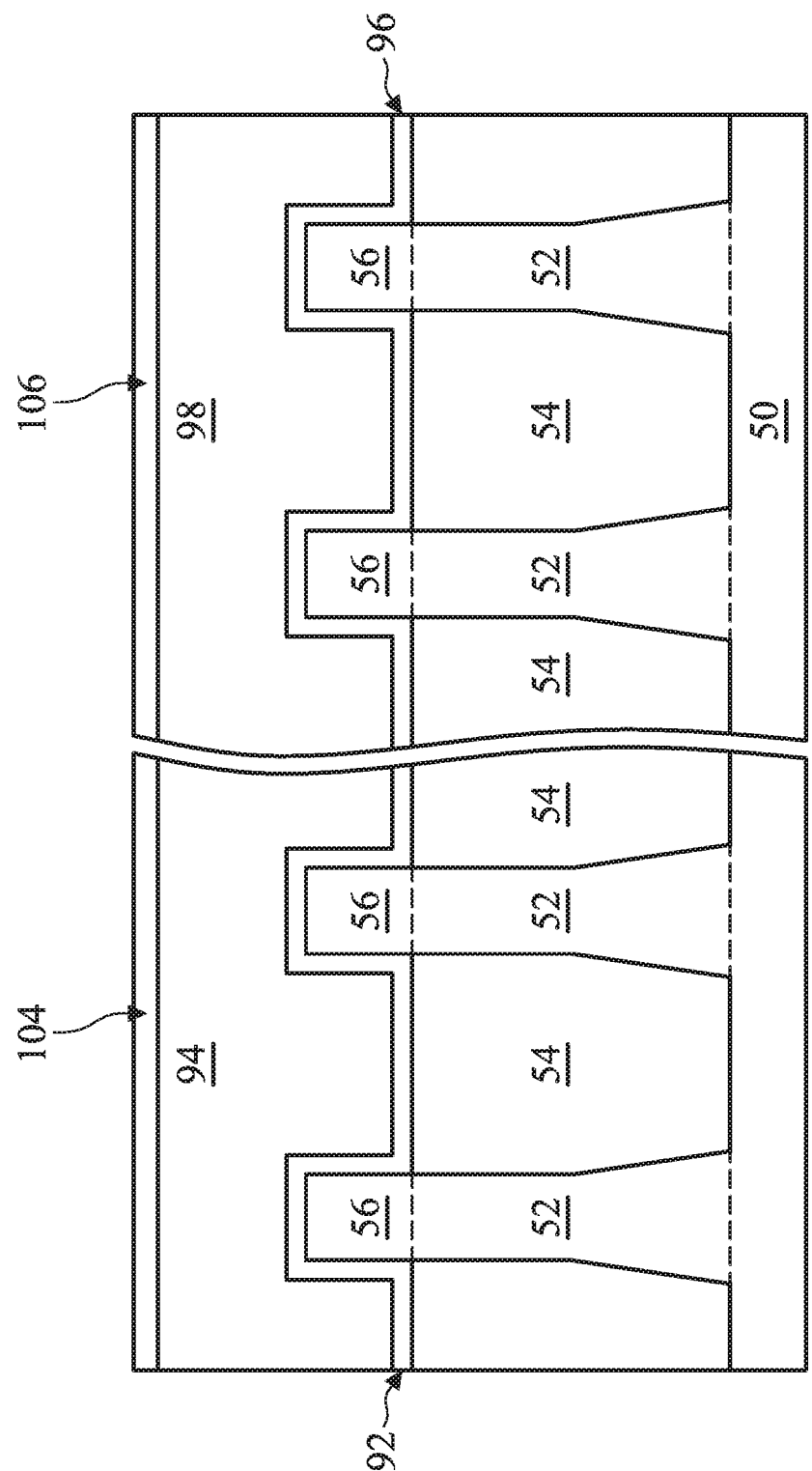
Figure 15B:
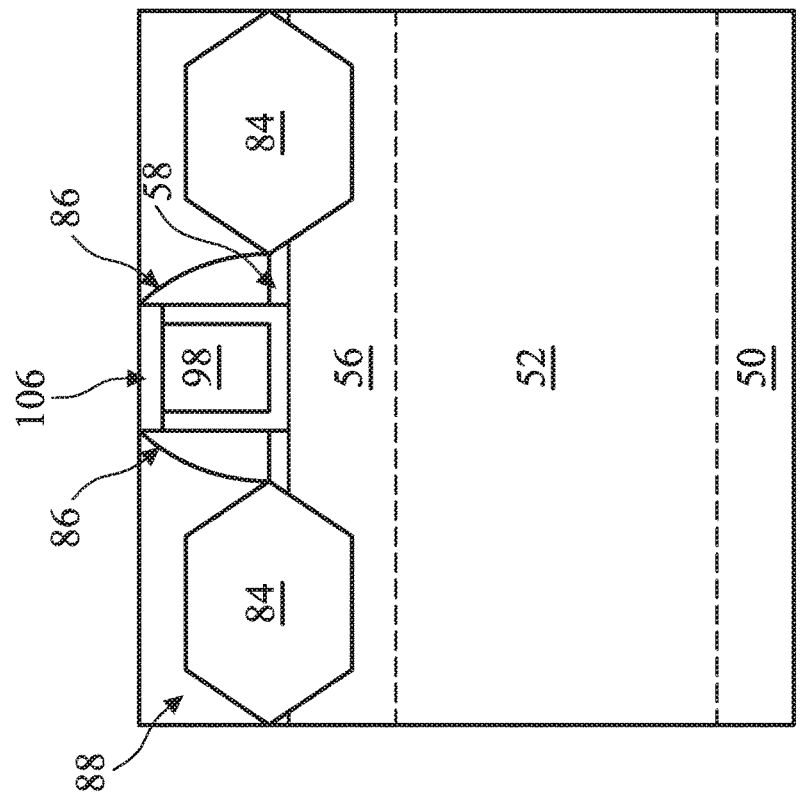
Figure 15C:
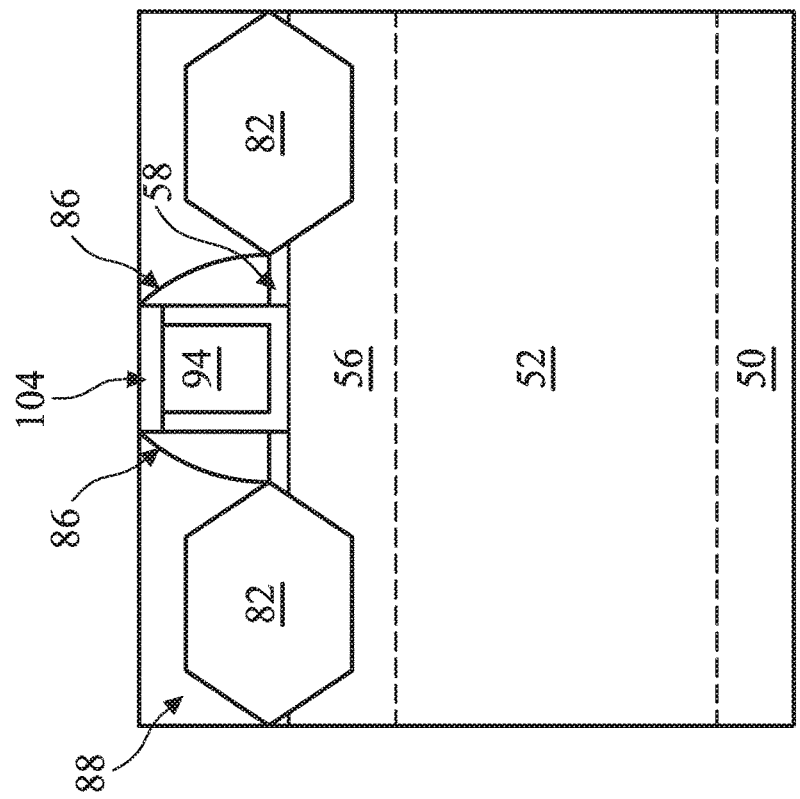

In FIGS. 15A, 15B, and 15C, masks 104 and 106 are formed in the recesses 100 and 102, respectively and over the gate dielectric layers 92 and 96 and the gate electrodes 94 and 98. The masks 104 and 106 provides protection for the gate spacers 86 during subsequent self-aligned contact etching steps to ensure that the self-aligned contact does not short one of the gate electrodes 94 and 98 to the corresponding contacts for the source/drain regions 82 and 84. The masks 104 and 106 may include, for example, silicon nitride or the like. The material composition of the masks 104 and 106 may ensure a high film density and a non-volatile etching byproduct. The masks 104 and 106 may be formed by CVD, PVD, ALD, a spin-on-dielectric process, the like, or a combination thereof. After the masks 104 and 106 are formed, a CMP may be performed so that the top surfaces of the masks 104 and 106, the ILD 88, and the gate spacers 86 are level.

Figure 16A:
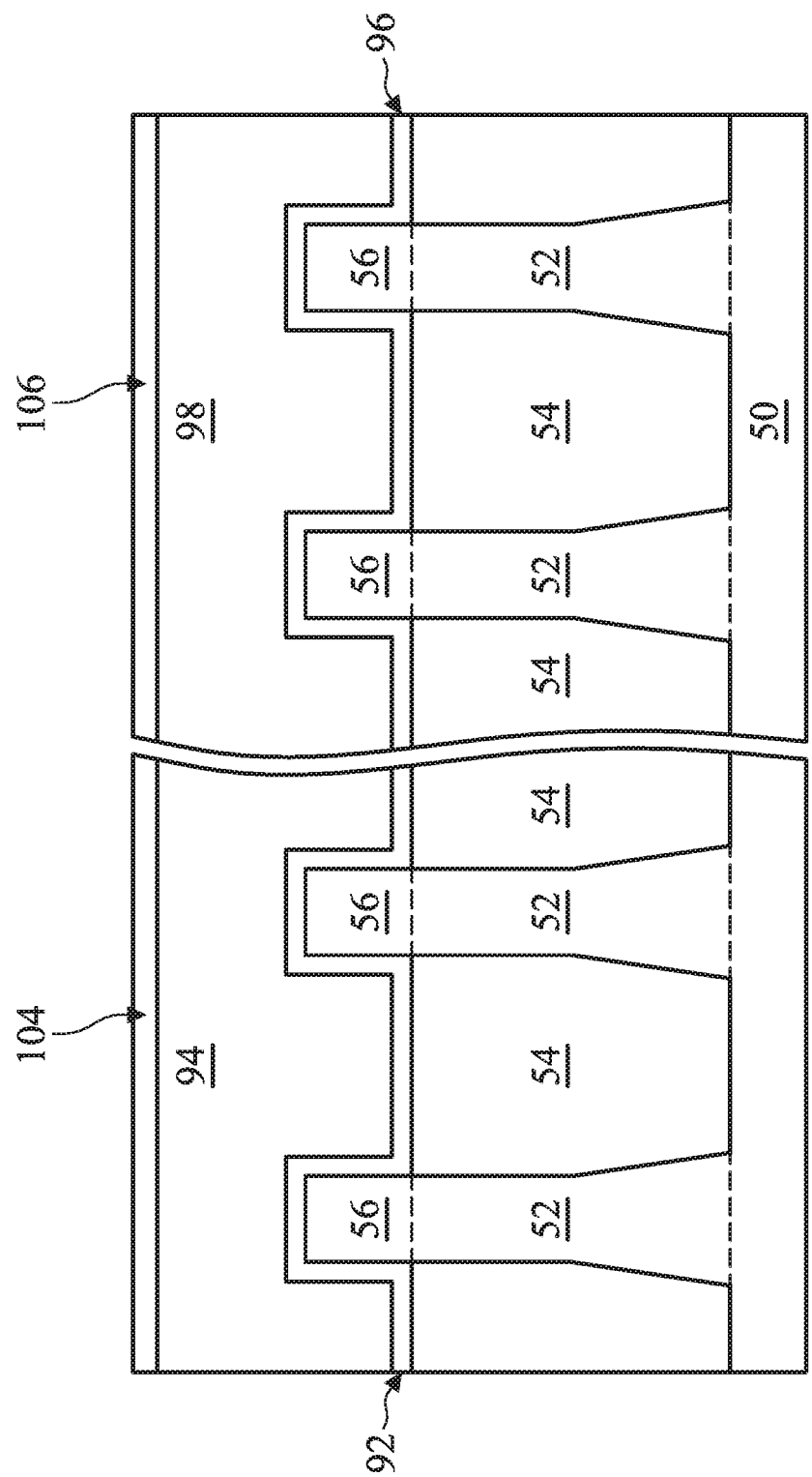
Figure 16C:
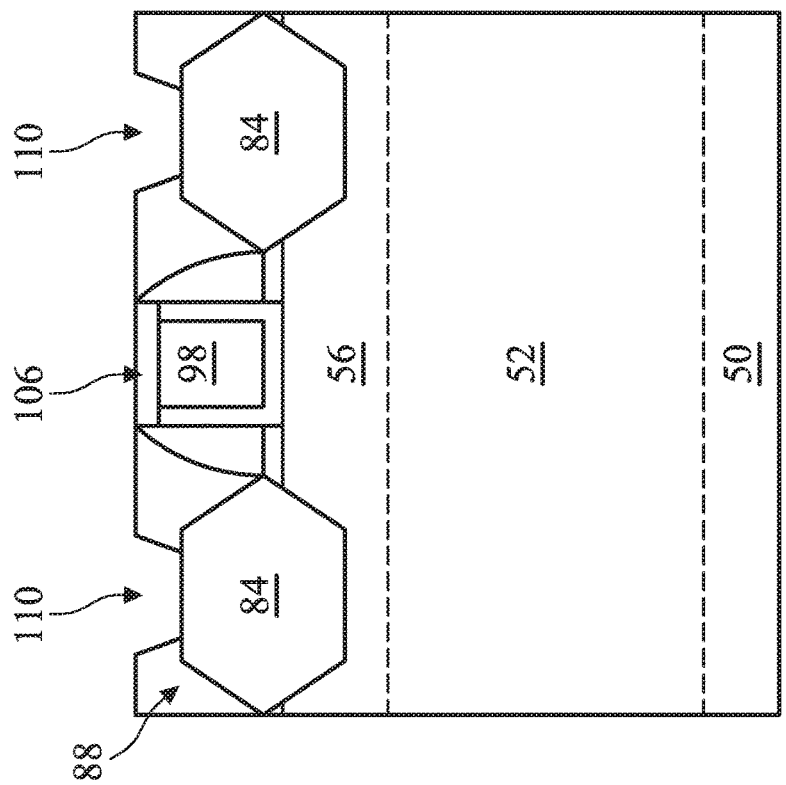
Figure 16B:
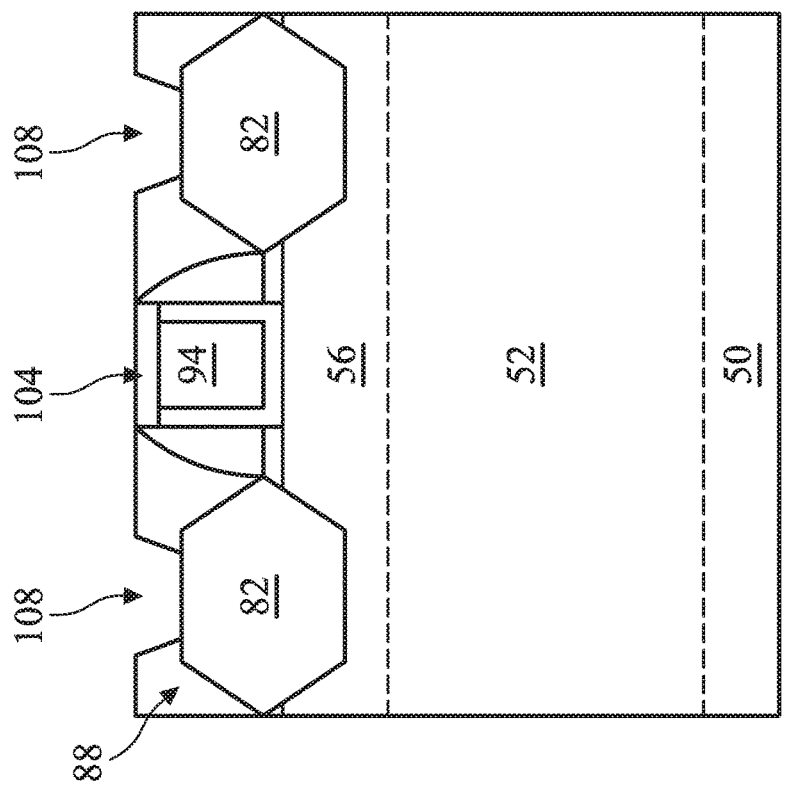

In FIGS. 16A, 16B, and 16C, openings 108 and 110 are formed through ILD 88 to expose portions of the source/drains 82 and 84, respectively. The openings 108 and 110 may all be formed simultaneously in a same process, or in separate processes. The openings 108 and 110 may be formed using acceptable photolithography and etching techniques.

Figure 17A:
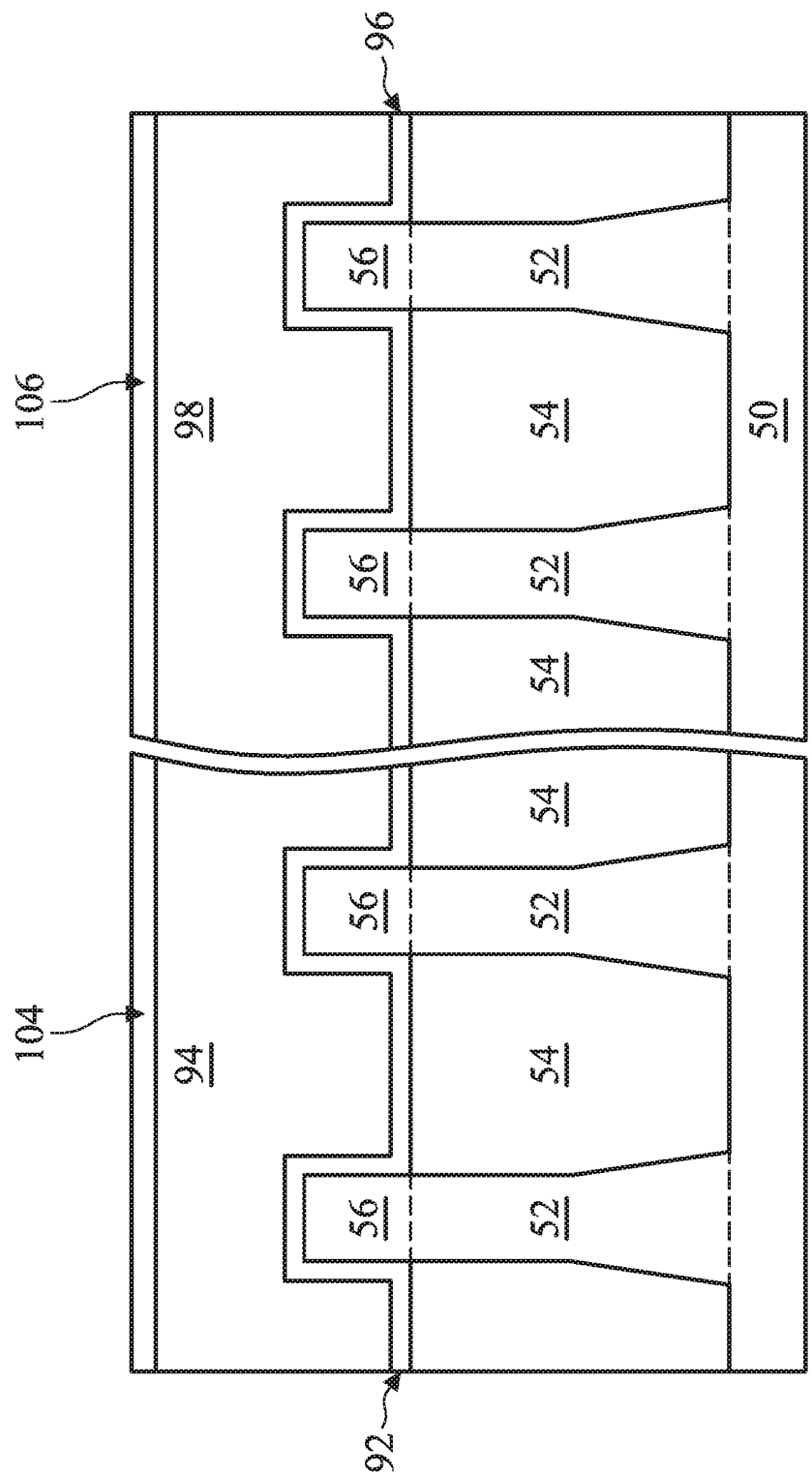
Figure 17C:
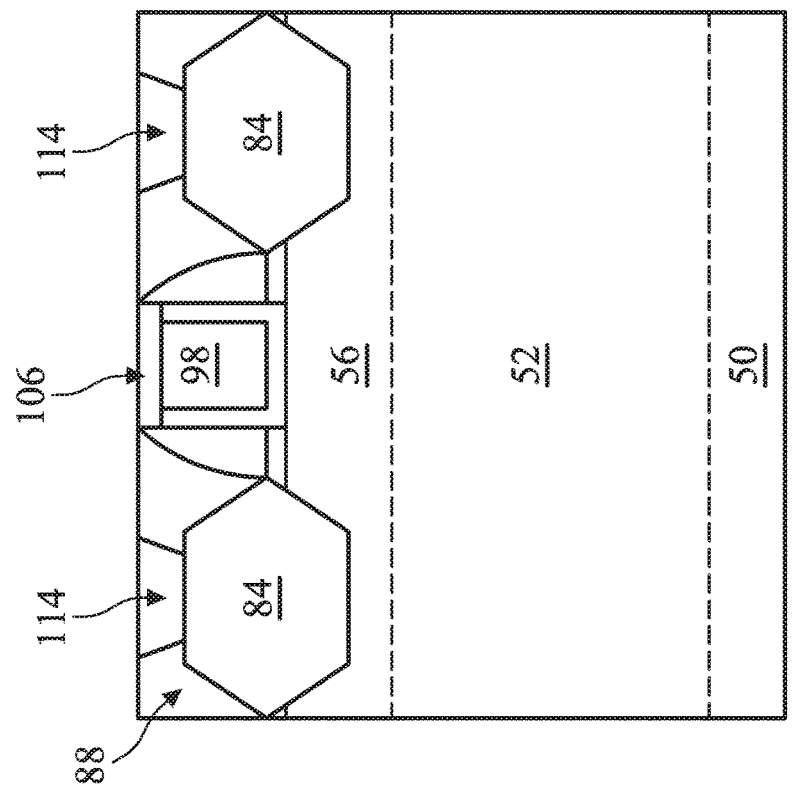
Figure 17B:
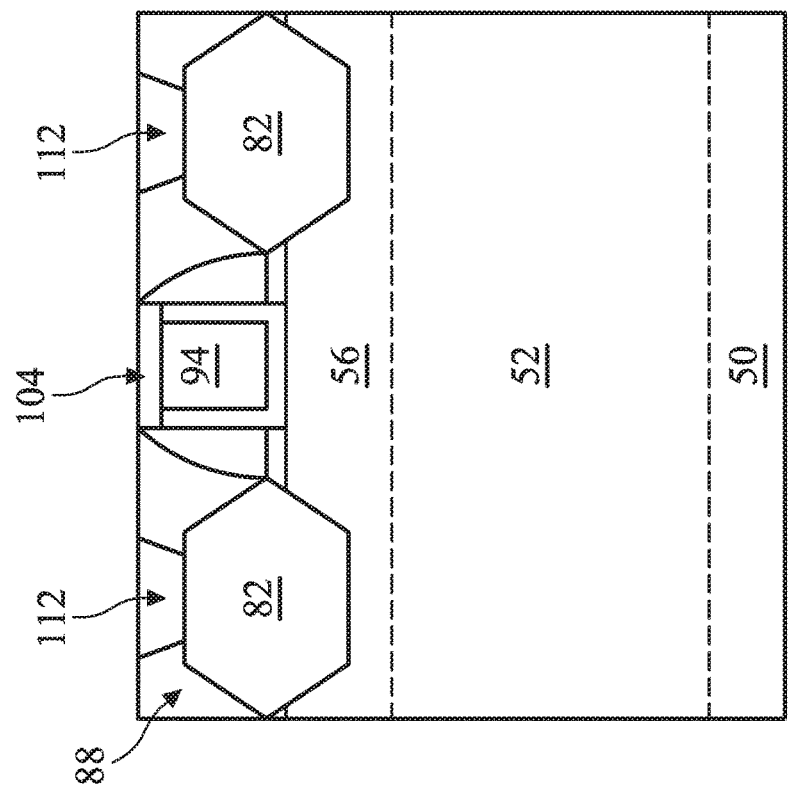

In FIGS. 17A, 17B, and 17C, conductive contacts 112 and 114 are formed in the openings 108 and 110, respectively. A liner (not shown), such as a diffusion barrier layer, an adhesion layer, or the like, and a conductive material are formed in the openings 108 and 110. The liner may include titanium, titanium nitride, tantalum, tantalum nitride, or the like. The conductive material may be copper, a copper alloy, silver, gold, tungsten, aluminum, nickel, cobalt, or the like. A planarization process, such as a CMP, may be performed to remove excess material from a surface of the ILD 88. The remaining liner and conductive material form contacts 112 and 114 in the openings. An anneal process may be performed to form a silicide at the interface between the epitaxial source/drain regions 82 and 84 and the contacts 112 and 114, respectively. Contacts 112 are physically and electrically coupled to the epitaxial source/drain regions 82, and contacts 114 are physically and electrically coupled to the epitaxial source/drain regions 84.

Figure 18A:
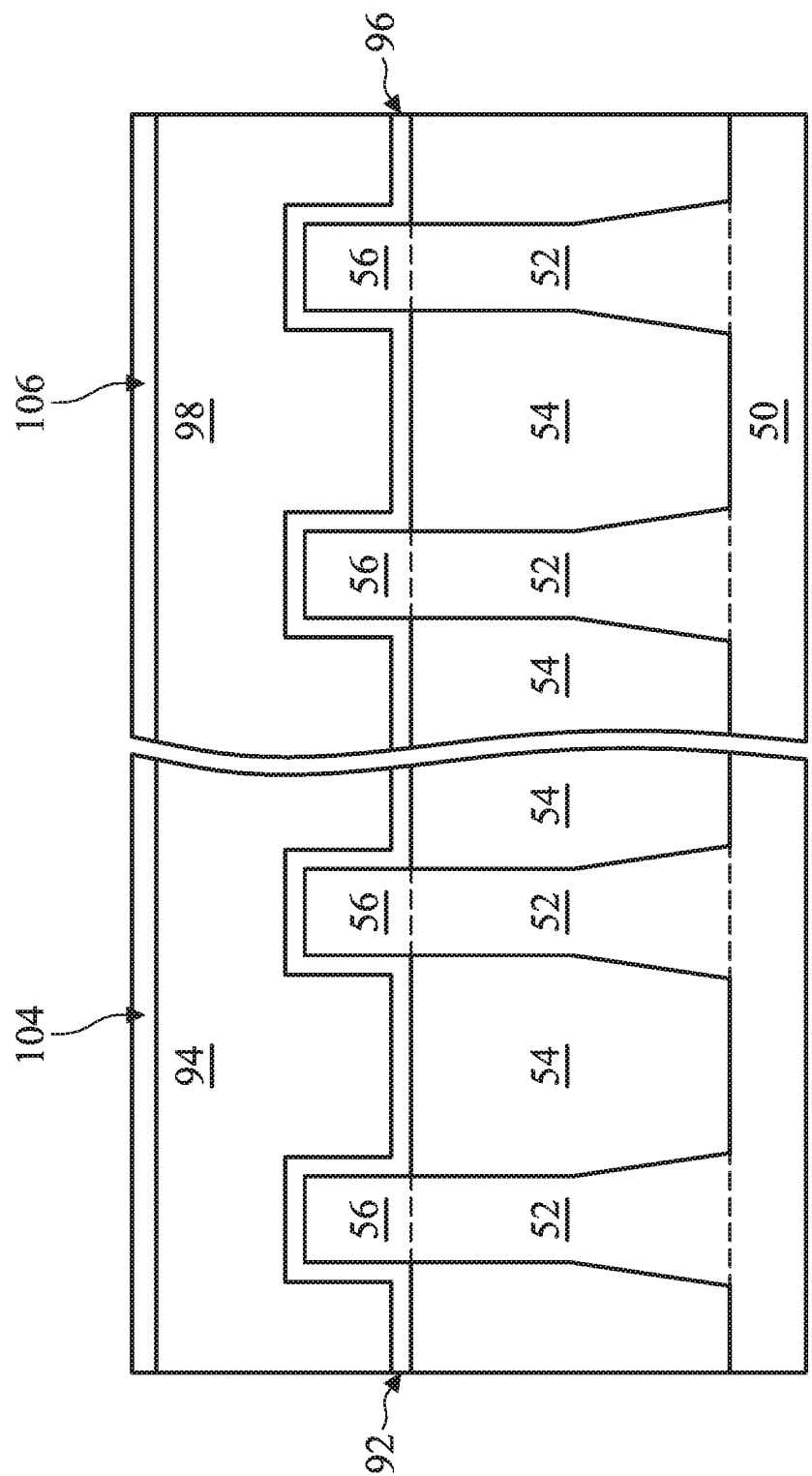
Figure 18C:
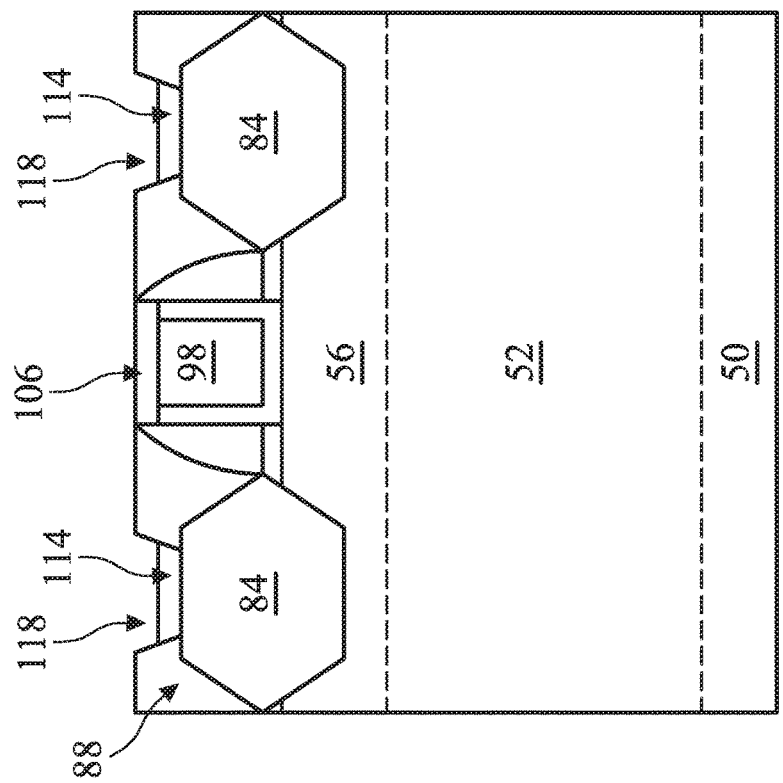
Figure 18B:
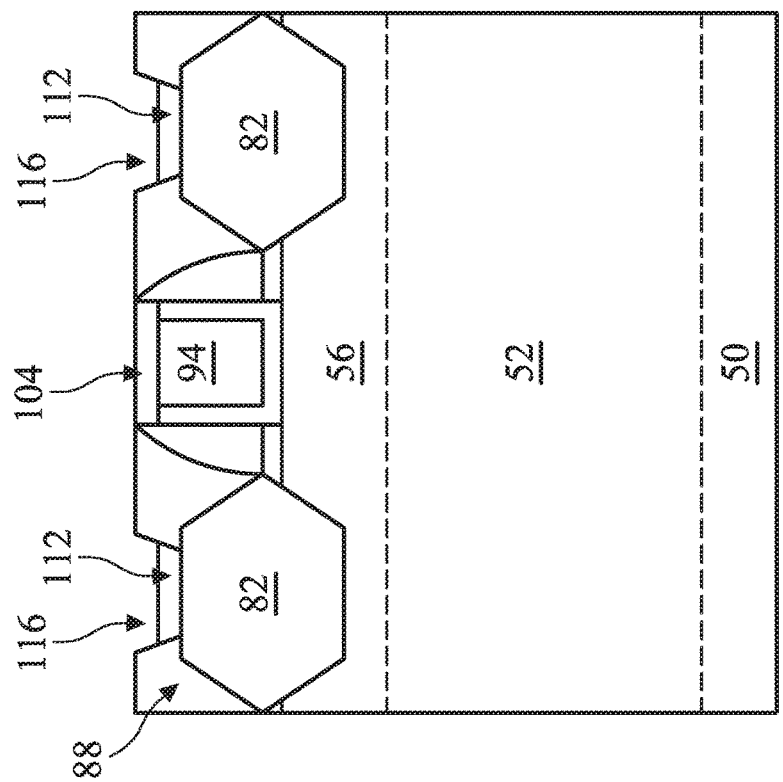

In FIGS. 18A, 18B, and 18C, the conductive contacts 112 and 114 are recessed in an etching step(s), so that recesses 116 and 118 are formed. The etching step(s) may include an anisotropic dry etch or an isotropic etch. For example, the etching step(s) may include a dry etch process using halogen-based reaction gas(es) that selectively etch the conductive contacts 112 and 114 without etching the ILD 88 or the masks 104 or 106.

Figure 19A:
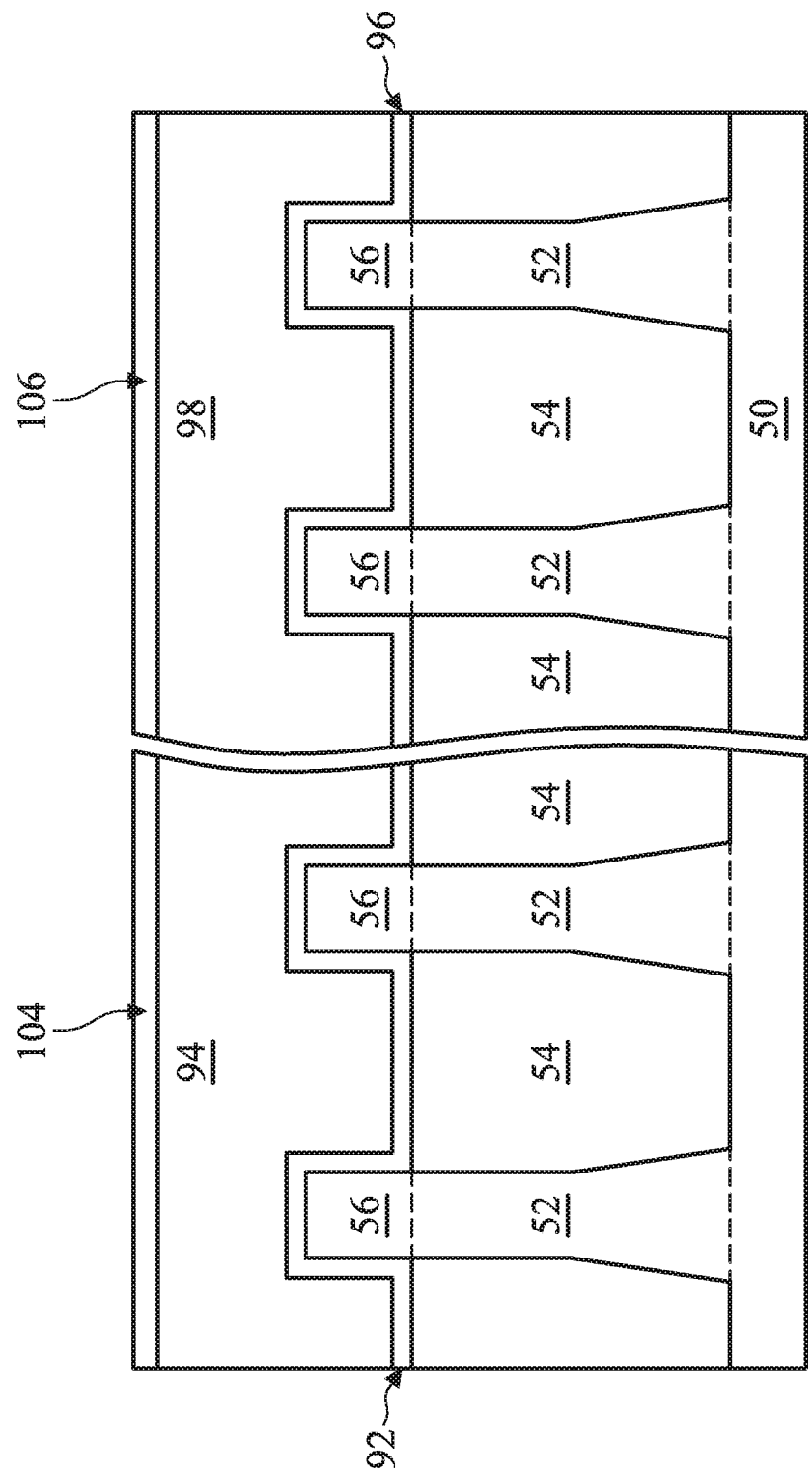
Figure 19C:
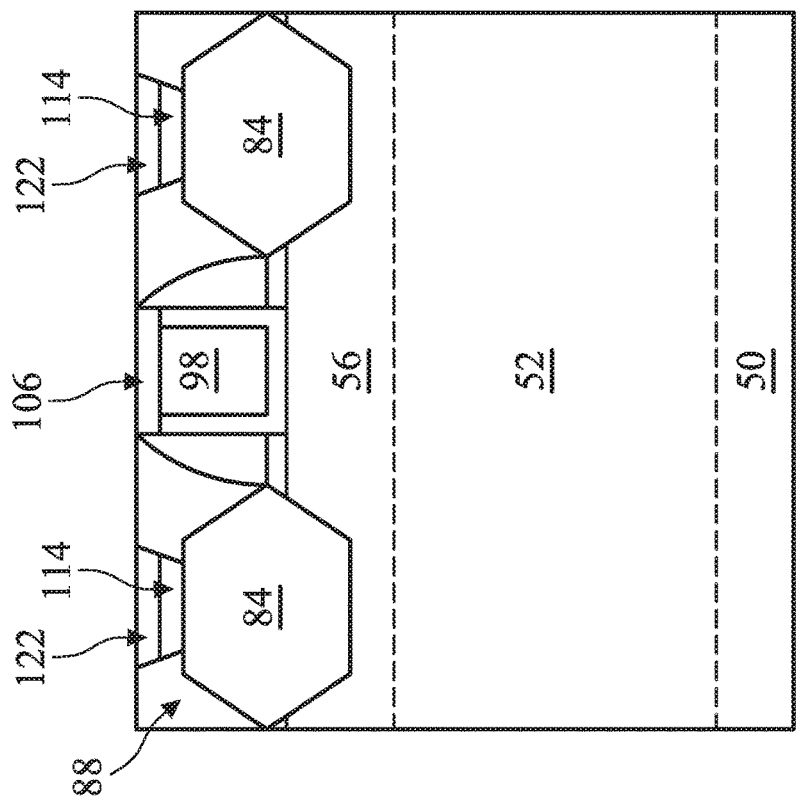
Figure 19B:
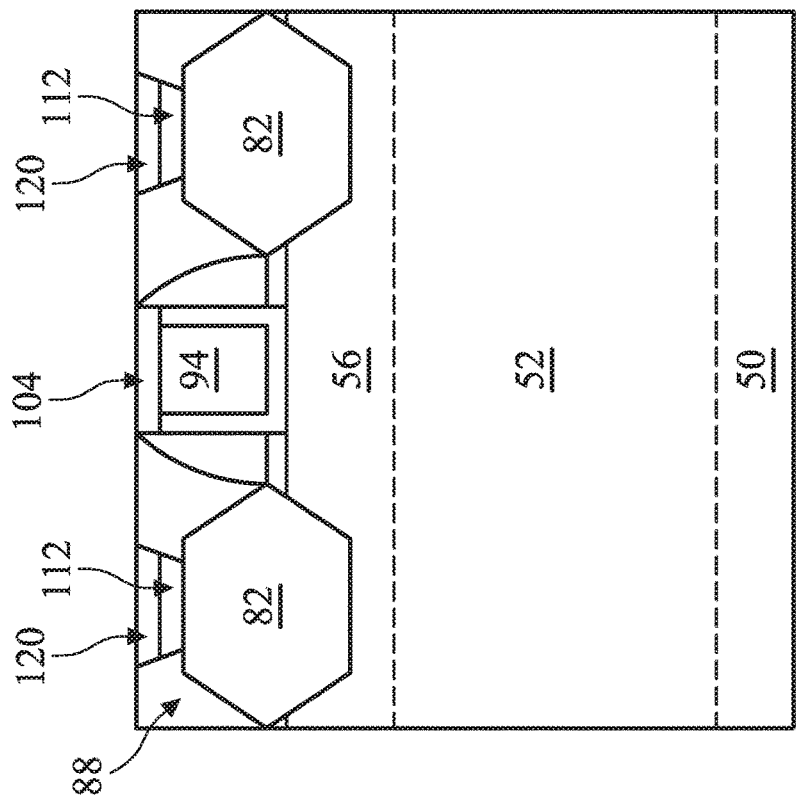

In FIGS. 19A, 19B, and 19C, masks 120 and 122 are formed in the recesses 116 and 118, respectively, and over the conductive contacts 112 and 114. The masks 120 and 122 provides protection for the conductive contacts 112 and 114 during subsequent contact formation above the gate electrodes 94 and 98 to ensure that the contacts do not short to the conductive contacts 112 and 114 for the source/drain regions 82 and 84. The masks 120 and 122 may include, for example, silicon nitride (SiN), silicon oxycarbide (SiOC), silicon carbide (SiC), the like, or a combination thereof. The material composition of the masks 120 and 122 may ensure a high film density and a non-volatile etching byproduct. The masks 120 and 122 may be deposited by any suitable method, such as CVD, comprising plasma-enhanced CVD (PECVD) or a spin-on-dielectric process. In some embodiments, the plasma source of the PECVD process may be a remote plasma system. In some embodiments, the plasma source may be an inductively coupled plasma (ICP) or the like.

In some embodiments, the masks 120 and 122 are formed with a radical-containing plasma component (e.g., of a first reactive source) in combination with an unexcited component (e.g., a second reactive source) to deposit the masks 120 and 122 with the first reactive source being $H_2$, $O_2$, the like or a combination thereof and the second reactive source including a siloxane source and a dilute source, the dilute source being He. In some embodiments, the process temperature is in a range from about 200° C. to about 500° C., the pressure during the process is in a range from about 1 Torr to about 10 Torr. In some embodiments, the remote plasma source can use radio frequency or micro-wave with the power being in a range from about 1000 Watts to about 4000 Watts. In some embodiments, the first reactive source includes $H_2$ with its flow is in a range from about 500 Standard Cubic Centimeters per Minute (sccm) to about 25000 sccm, the first reactive source also includes $O_2$ and its flow is in a range from about 0 sccm to about 20 sccm, and the second reactive source (e.g. siloxane source) has a flow in a range from about 1 sccm to about 30 sccm.

After the masks 120 and 122 are formed, a CMP may be performed so that the top surfaces of the masks 120, 122, 104, 106, the ILD 88, and the gate spacers 86 are level.

Figure 20A:
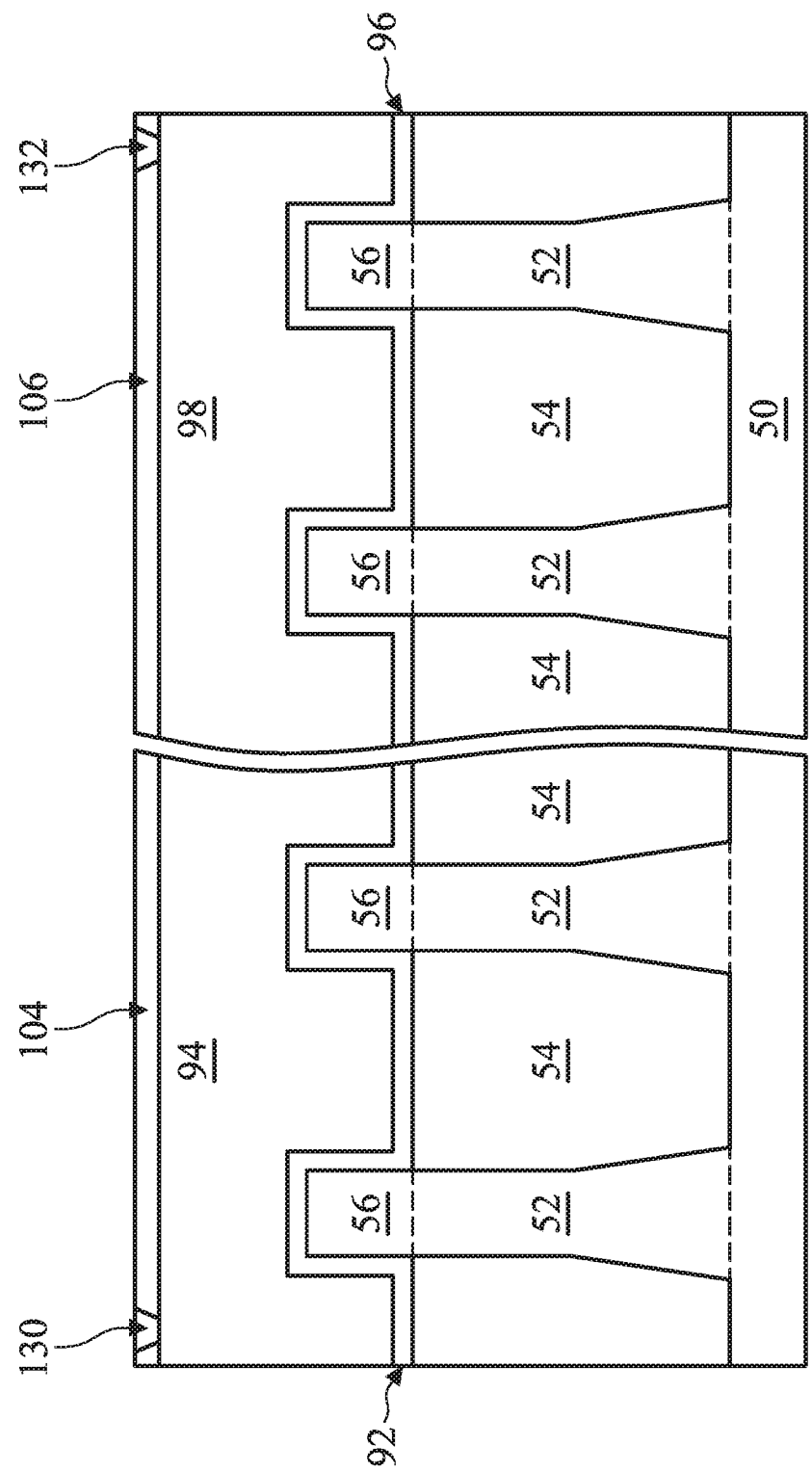
Figure 20C:
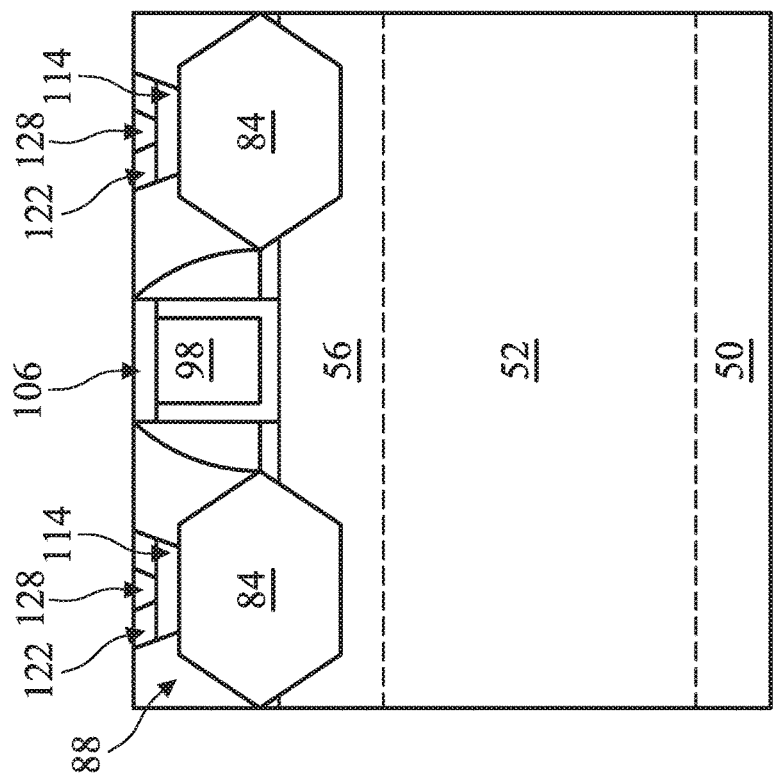
Figure 20B:
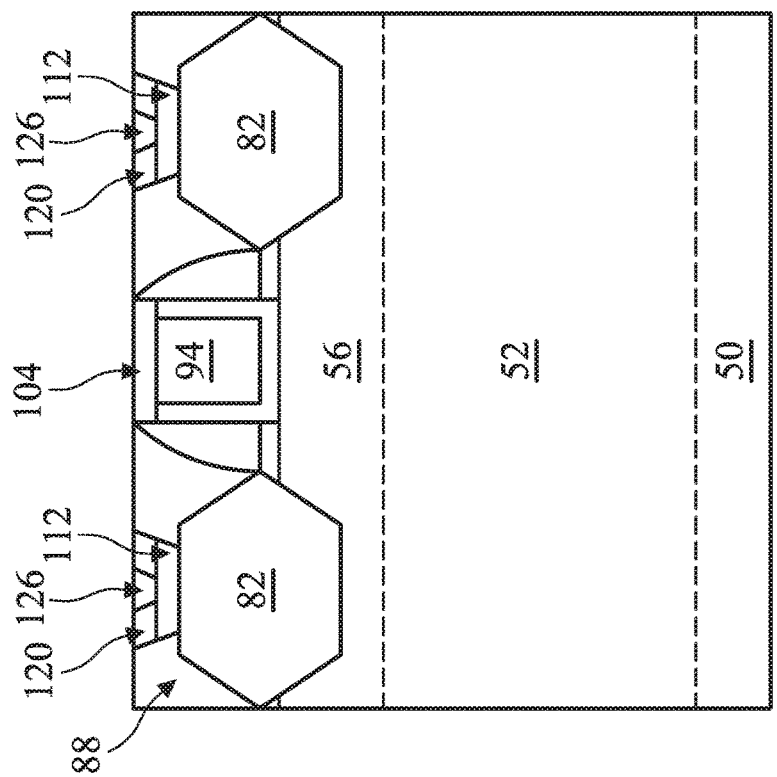

In FIGS. 20A, 20B, and 20C, conductive contacts 126, 128, 130, and 132 are formed through masks 120, 122, 104, and 106, respectively. Openings for conductive contacts 126 and 128 are formed through the masks 120 and 122, respectively. Openings for contacts 130 and 132 are formed through the masks 104 and 106, respectively. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, cobalt, or the like. A planarization process, such as a CMP, may be performed to remove excess material from a surface of the ILD 88 and the masks. The remaining liner and conductive material form contacts 126, 128, 130, and 132 in the openings. The conductive contacts 126 are physically and electrically coupled to the conductive contacts 112, conductive contacts 128 are physically and electrically coupled to the conductive contacts 114, conductive contact 130 is physically and electrically coupled to the gate electrode 94, and conductive contact 106 is physically and electrically coupled to the gate electrode 98.

In this embodiment, the masks 104 and 106 over the gate electrodes are formed first and the masks 120 and 122 over the source/drain contacts are formed second, but, in other embodiments, the order may be reversed with the masks 120 and 122 being formed first. In other embodiments, the masks 104 and 106 are formed over the source/drain contacts and the masks 120 and 122 are formed over the gate electrodes.

Although not explicitly shown, a person having ordinary skill in the art will readily understand that further processing steps may be performed on the structure in FIGS. 20A, 20B, and 20C. For example, various IMDs and their corresponding metallizations may be formed over ILD 88.

FIGS. 21A-21C and 22A-22C are cross-sectional views of intermediate stages in the manufacturing of FinFETs in accordance with some embodiments. The embodiment in FIGS. 21A-21C and 22A-22C is similar to the embodiments illustrated in FIGS. 2 through 20C except that this embodiment includes a liner insulation layer between the source/drain contacts 112 and 114 and the masks 120 and 122. The materials and processing steps to arrive at the intermediate structure illustrated in FIGS. 21A-21C may be similar to the previously described embodiment in FIGS. 1 through 18C, and thus, the description is not repeated herein. Details regarding this embodiment that are similar to those for the previously described embodiment will not be repeated herein.

Figure 21A:
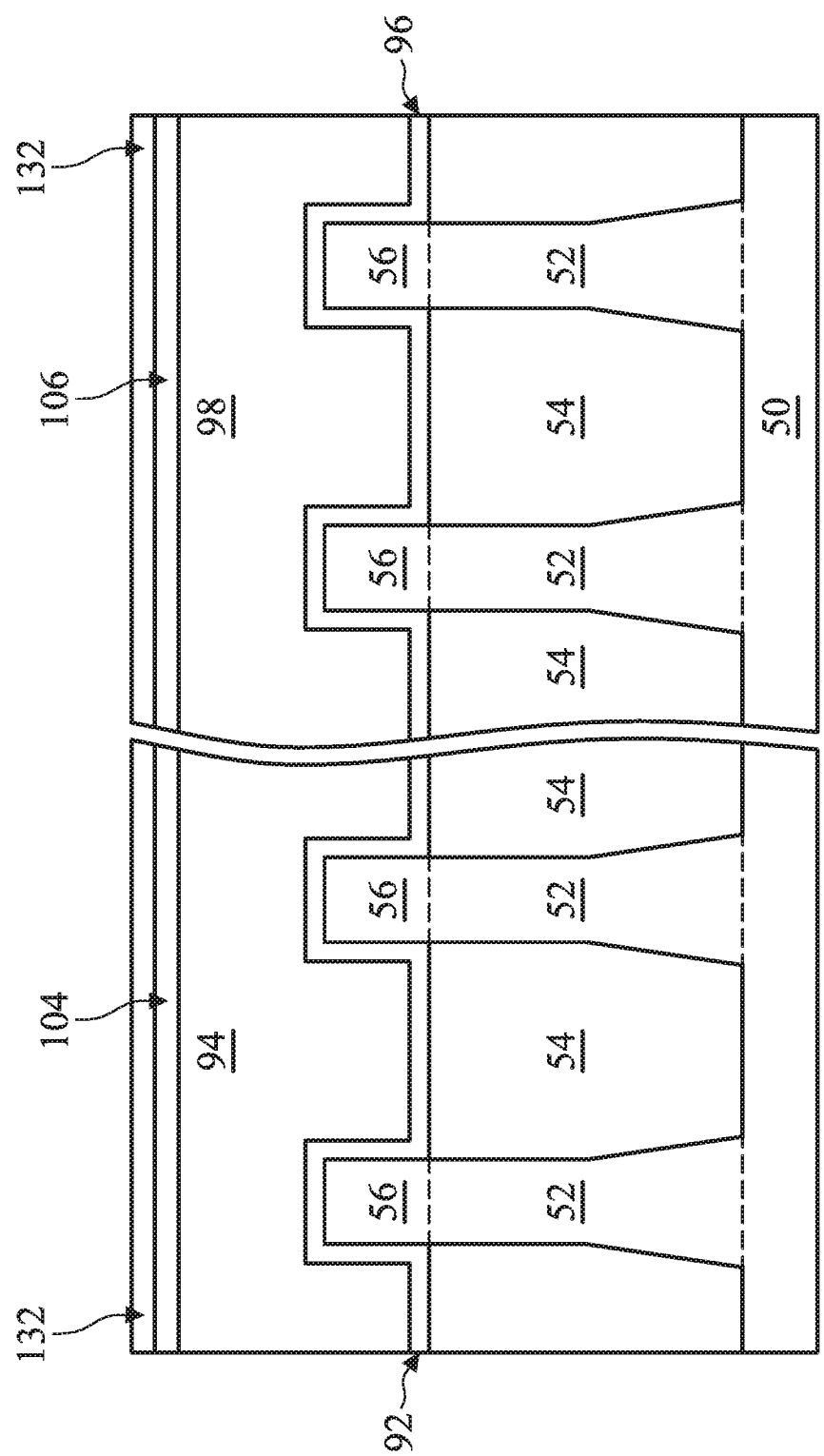
FIGS. 21A-21C and 22A-22C are cross-sectional views of intermediate stages in the manufacturing of FinFETs in accordance with some embodiments.
Figure 21C:
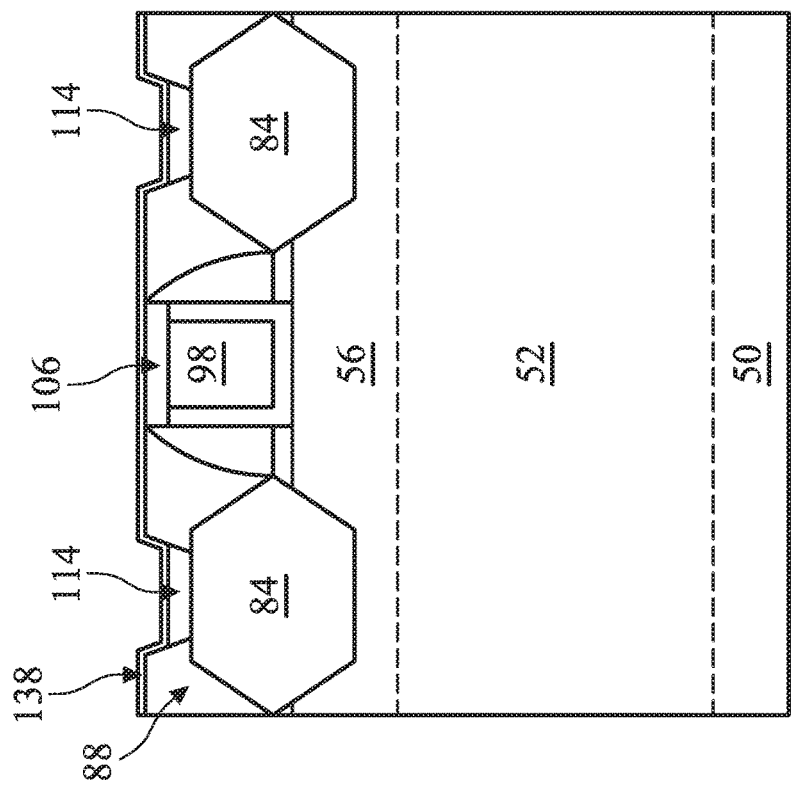
Figure 21B:
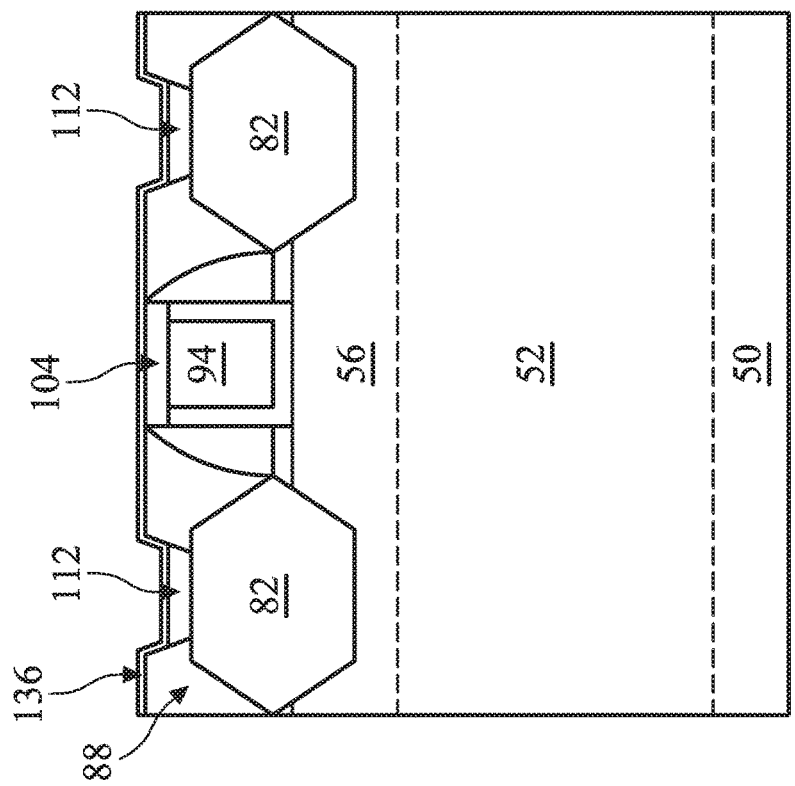

In FIGS. 21A, 21B, and 21C, liner insulation layers 136 and 138 are formed over the structure illustrated FIGS. 18A, 18B, and 18C and in the openings 116 and 118 over the source/drain contacts 112 and 114. In some embodiments, the liner insulation layers 136 and 138 may be a metallic oxide or metallic nitride comprising aluminum, titanium, hafnium, zirconium, tantalum, a different metal component, the like, or a combination thereof and may be formed by ALD, CVD, the like, or a combination thereof.

In some embodiments, the ALD process for forming the liner insulation layers 136 and 138 may include a plasma process before the ALD process comprising a hydrogen contain source such as $H_2$, $NH_3$, the like, or a combination thereof. The benefit of the plasma is to clean the surface and remove native oxide to improve adhesion behavior. The pressure of the plasma is in a range from about 1 Torr to about 10 Torr with the power of the plasma being in a range from about 100 Watts to about 1500 Watts.

In some embodiments, the forming of the formation of the liner insulation layers 136 and 138 may include a post-treatment of a plasma process including an H-based chemical, such as $H_2$, $NH_3$, the like, or a combination thereof. The benefit of the post-treatment is to densify the film by removing impurities such as organic sources. The pressure during the post-treatment is in a range from about 1 Torr to about 10 Torr and the power of the plasma being in a range from about 100 Watts to about 1500 Watts.

In some embodiments, the ALD process comprises a first reaction source being a metallic source with source flow in a range from about 10 sccm to about 300 sccm, a second reaction source being a nitrogen-containing source with source flow in a range from about 1000 sccm to about 10000 sccm. In these embodiments, the ALD process temperature is in a range from about 200° C. to about 400° C. and the pressure is in a range from about 1 Torr to about 10 Torr.

After the formation of the liner insulation layers 136 and 138, excess liner insulation layers 136 and 138 may be removed from the top surface of the ILD 88 and the masks 104 and 106.

Figure 22A:
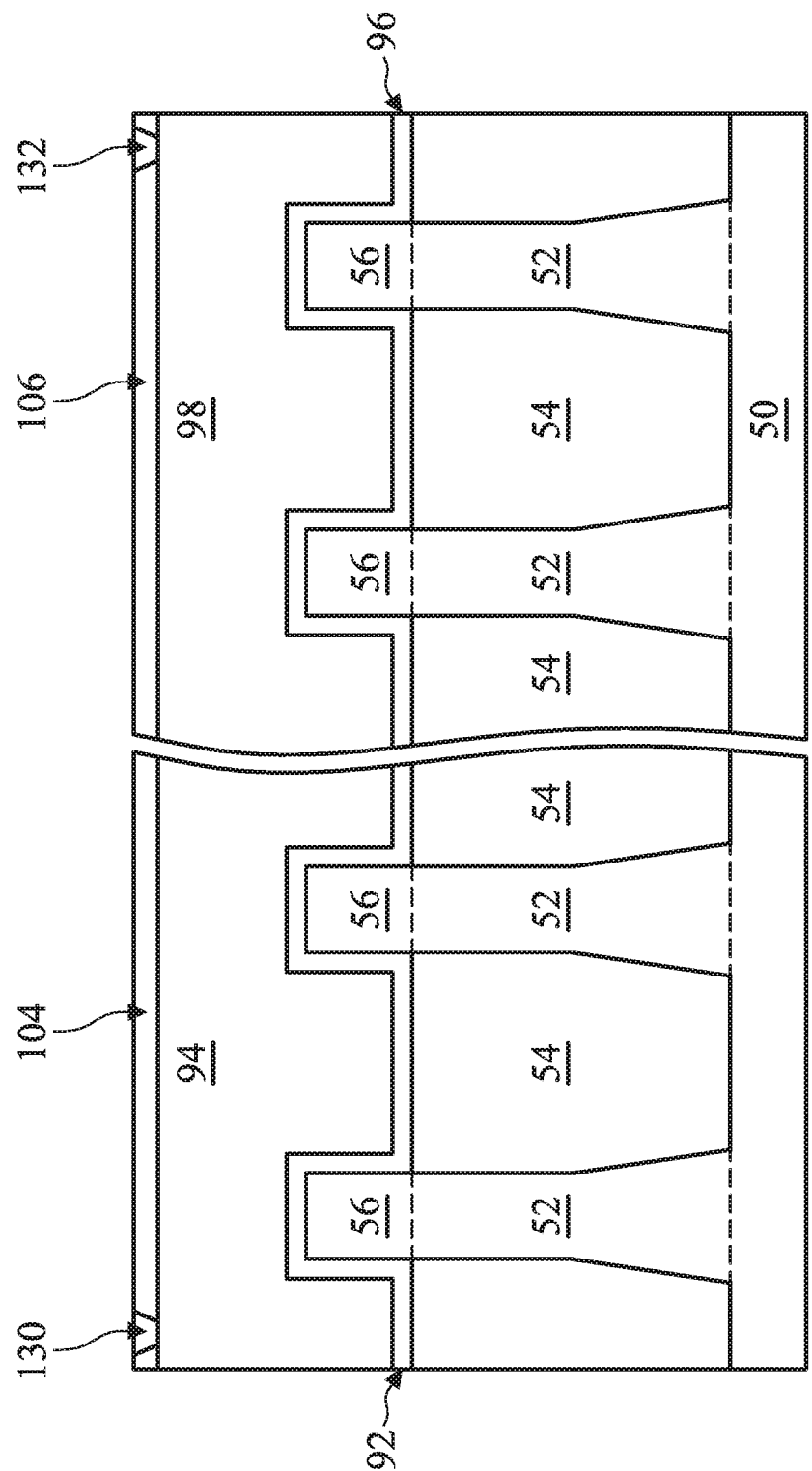
Figure 22C:
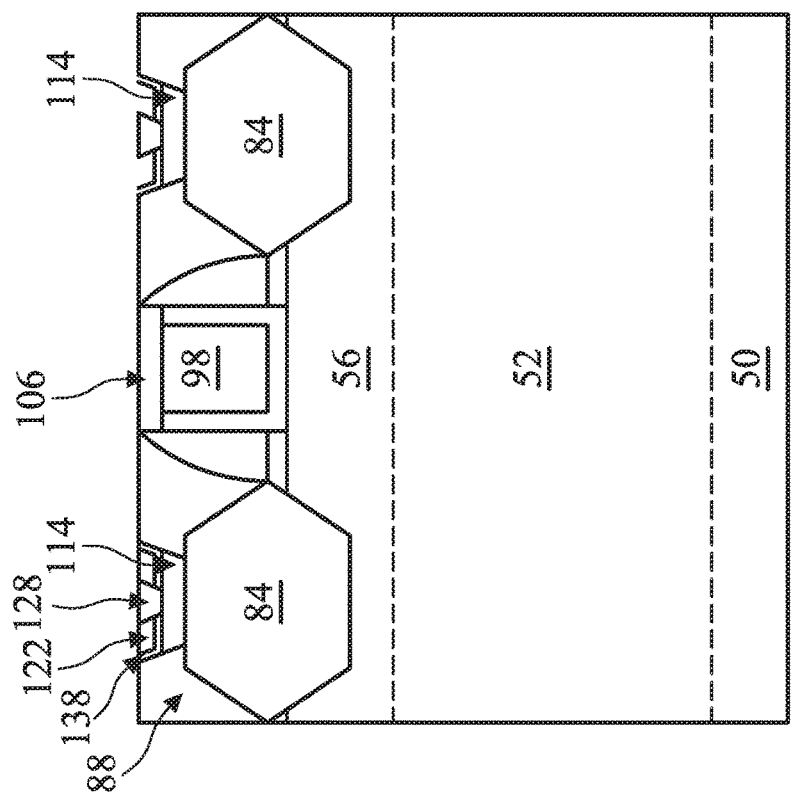
Figure 22B:
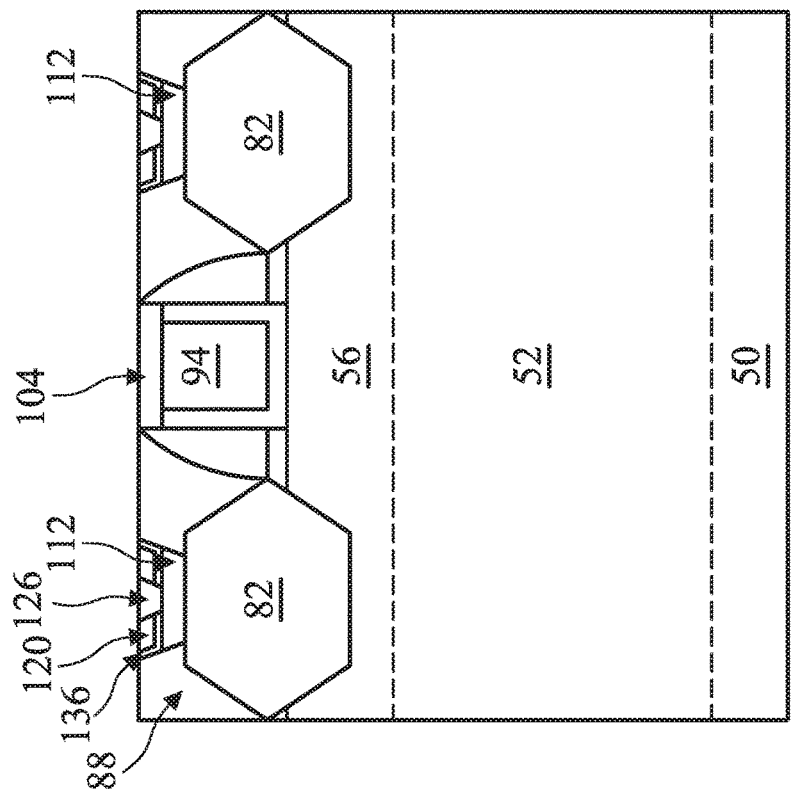

In FIGS. 22A, 22B, and 22C, conductive contacts 126, 128, 130, and 132 are formed through masks 120, 122, 104, and 106, respectively. Openings for conductive contacts 126 and 128 are formed through the masks 120 and 122, respectively, and the liner insulation layers 136 and 138, respectively. Openings for contacts 130 and 132 are formed through the masks 104 and 106, respectively. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, cobalt, or the like. A planarization process, such as a CMP, may be performed to remove excess material from a surface of the ILD 88 and the masks. The remaining liner and conductive material form contacts 126, 128, 130, and 132 in the openings. The conductive contacts 126 are physically and electrically coupled to the conductive contacts 112, conductive contacts 128 are physically and electrically coupled to the conductive contacts 114, conductive contact 130 is physically and electrically coupled to the gate electrode 94, and conductive contact 106 is physically and electrically coupled to the gate electrode 98.

In this embodiment, the masks 104 and 106 over the gate electrodes are formed first and the masks 120 and 122 over the source/drain contacts are formed second, but, in other embodiments, the order may be reversed with the masks 120 and 122 being formed first. In other embodiments, the masks 104 and 106 are formed over the source/drain contacts and the masks 120 and 122 are formed over the gate electrodes.

Although not explicitly shown, a person having ordinary skill in the art will readily understand that further processing steps may be performed on the structure in FIGS. 22A, 22B, and 22C. For example, various IMDs and their corresponding metallizations may be formed over ILD 88.

In some other embodiments, the conductive contacts for FinFETs are can be formed with a replacement contact technique. Replacement contacts are formed by forming a dummy contact, and then replacing the dummy contact with the conductive contact. The dummy contacts may be formed by transferring a replacement contact pattern to a dummy contact material through tri-layer lithography, which may include patterning a mask layer on the dummy contact material, and then forming a photoresist top layer on the mask layer. A dry etch process may be used to remove a portion of the dummy contact in subsequent processing steps, and an inter-layer dielectric (ILD) may be formed around the remaining dummy contacts.

By providing self-aligning masks over both the gate electrode and the source/drain contacts, the possibility of electrical shorts/leakage between a gate electrode and source/drain contacts is reduced when forming vias to the gate electrode and/or source/drain contacts. In addition, these self-aligning masks over both the gate electrode and the source/drain contacts allows for the layout of the gate electrode to be shortened as the via to the gate electrode can be closer to the vias for the source/drain contacts. These masks over the gate electrode and the source/drain contacts ensures that the overlying vias do not electrically short the gate electrode to the source/drain contacts even when the overlying vias are misaligned.

An embodiment is a method including recessing a gate electrode over a semiconductor fin on a substrate to form a first recess from a top surface of a dielectric layer, forming a first mask in the first recess over the recessed gate electrode, recessing a first conductive contact over a source/drain region of the semiconductor fin to form a second recess from the top surface of the dielectric layer, and forming a second mask in the second recess over the recessed first conductive contact.

Another embodiment is a method including forming fins on a substrate, forming an isolation region surrounding the fins, forming a dummy gate structure over the fins, epitaxially growing source/drain regions on opposing sides of the dummy gate structure, forming an inter-layer dielectric over the isolation region and surrounding the dummy gate structure, replacing the dummy gate structure with an active gate structure, recessing the active gate structure to form a first recess, forming a first mask in the first recess, forming first conductive contacts through the inter-layer dielectric to the source/drain regions, recessing the first conductive contacts to form second recesses, and forming second masks in the second recesses.

A further embodiment is a structure including a first fin over a substrate, an isolation region surrounding lower surfaces of the first fin, a gate structure along sidewalls and over upper surfaces of the first fin, the gate structure defining a channel region in the first fin, a source/drain region on the first fin adjacent the gate structure, a dielectric layer over the isolation region and surrounding the gate structure, a first mask over the gate structure, the first mask having a top surface level with a top surface of the dielectric layer, a first conductive contact through the dielectric layer to contact the source/drain region, and a second mask over the first conductive contact, the second mask having a top surface level with the top surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    recessing a gate electrode over a semiconductor fin on a substrate to form a first recess from a top surface of a dielectric layer;
    forming a first mask in the first recess over the recessed gate electrode;
    recessing a first conductive contact over a source/drain region of the semiconductor fin to form a second recess from the top surface of the dielectric layer; and
    forming a second mask in the second recess over the recessed first conductive contact.

2. The method of claim 1, wherein the first recess is formed before the second recess.

3. The method of claim 1, wherein the second recess is formed before the first recess.

4. The method of claim 1, wherein the material composition of the first mask is different from the material composition of the second mask.

5. The method of claim 1 further comprising:
    forming a liner insulation layer in the second recess, the liner insulation layer being interposed between the first conductive contact and the second mask.

6. The method of claim 5, wherein the liner insulation layer is a metallic oxide or metallic nitride comprising aluminum, titanium, hafnium, zirconium, tantalum, or a combination thereof, and wherein the second mask comprises silicon oxynitride, silicon carbide, carbon-containing silicon oxide, or a combination thereof.

7. The method of claim 1, wherein the first mask comprises silicon nitride, and wherein the second mask comprises silicon oxynitride, silicon carbide, carbon-containing silicon oxide, or a combination thereof.

8. The method of claim 1 further comprising:
    forming a second conductive contact through the first mask to be coupled to the gate electrode and
    forming a third conductive contact through the second mask to be electrically coupled to the first conductive contact.

9. The method of claim 8, wherein top surfaces of the dielectric layer, second conductive contact, and third conductive contact are level.

10. The method of claim 1 further comprising:
    forming a dummy gate structure over the semiconductor fin;
    forming a gate spacer on sidewalls of the dummy gate structure;
    forming the dielectric layer surrounding the gate spacer and the dummy gate structure; and
    replacing the dummy gate structure with an active gate structure, the active gate structure comprising a gate dielectric on the semiconductor fin and the gate electrode on the gate dielectric.

11. A method comprising:
    forming fins on a substrate;
    forming an isolation region surrounding the fins;
    forming a dummy gate structure over the fins;
    epitaxially growing source/drain regions on opposing sides of the dummy gate structure;
    forming an inter-layer dielectric over the isolation region and surrounding the dummy gate structure;
    replacing the dummy gate structure with an active gate structure;
    recessing the active gate structure to form a first recess;
    forming a first mask in the first recess;
    forming first conductive contacts through the inter-layer dielectric to the source/drain regions;
    recessing the first conductive contacts to form second recesses; and
    forming second masks in the second recesses.

12. The method of claim 11, wherein the first recess is formed before the second recesses.

13. The method of claim 11, wherein the second recesses are formed before the first recess.

14. The method of claim 11 further comprising:
    forming a liner insulation layer in the second recesses, the liner insulation layer being interposed between the first conductive contacts and the second masks.

15. The method of claim 11, wherein the first mask comprises silicon nitride, and wherein the second masks comprise silicon oxynitride, silicon carbide, or a combination thereof.

16. The method of claim 11 further comprising:
    forming a second conductive contact through the first mask to be coupled to the active gate structure; and
    forming third conductive contacts through the second masks to be electrically coupled to the first conductive contacts.

17. A method comprising:
    forming a fin on a substrate;
    forming an isolation structure surrounding a lower portion of the fin;
    forming a dummy gate structure over the fin;
    forming source/drain regions on the fin on opposing sides of the dummy gate structure;
    replacing the dummy gate structure with an active gate structure;
    recessing the active gate structure to form a first recess;
    forming a first mask layer in the first recess;
    forming first conductive contacts through to the source/drain regions;
    recessing the first conductive contacts to form second recesses; and
    forming second mask layers in the second recesses, the first mask layer having a different material composition than the second mask layers.

18. The method of claim 17, wherein the first recess is formed before the second recesses.

19. The method of claim 17, wherein the second recesses are formed before the first recess.

20. The method of claim 17 further comprising:
    forming a liner insulation layer in the second recesses, the liner insulation layer being interposed between the first conductive contacts and the second mask layers.

* * * * *